(12) United States Patent
Misumi et al.

(10) Patent No.: US 7,280,409 B2
(45) Date of Patent: Oct. 9, 2007

(54) NON-VOLATILE MEMORY DEVICE WITH THRESHOLD VOLTAGE CONTROL FUNCTION

(75) Inventors: Kenji Misumi, Kyoto (JP); Makoto Kojima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 90 days.

(21) Appl. No.: 11/377,433

(22) Filed: Mar. 17, 2006

(65) Prior Publication Data

US 2006/0221681 A1 Oct. 5, 2006

(30) Foreign Application Priority Data

Apr. 1, 2005 (JP) ............... 2005-106446

(51) Int. Cl.
*G11C 11/34* (2006.01)
(52) U.S. Cl. ............... 365/185.28; 365/185.29
(58) Field of Classification Search ........... 365/185.28, 365/185.29, 185.18
See application file for complete search history.

(56) References Cited

U.S. PATENT DOCUMENTS 5,598,368 A * 1/1997 Takahashi et al. ..... 365/185.01
6,246,608 B1 6/2001 Odani
6,452,837 B2 * 9/2002 Mori et al. ............. 365/185.24
6,556,475 B2 4/2003 Yamazaki et al.
7,099,210 B2 * 8/2006 Hashiba et al. ............. 365/200
2002/0012280 A1 1/2002 Yamamoto et al.

FOREIGN PATENT DOCUMENTS

JP 2002-208291 7/2002

* cited by examiner

*Primary Examiner*—Anh Phung
(74) *Attorney, Agent, or Firm*—McDermott Will & Emery LLP

(57) ABSTRACT

Even when the number of rewrite operations varies among erase unit areas, the number of rewrite operations is improved for all of the erase unit areas. A flash EEPROM 100 comprises a trimming value storing area 130 of storing a trimming value corresponding to each erase unit area 120 included in a memory cell array 110. When an erase operation and a write operation are performed with respect to a certain erase unit area 120, a regulator circuit 150 converts a voltage boosted by a booster circuit 140 to a level corresponding to the trimming value for the erase unit area 120. When a read determination circuit 170 detects an abnormality as the number of rewrite operations is increased, the trimming value is updated to a value which causes the regulator circuit 150 to increase the output voltage.

23 Claims, 19 Drawing Sheets

NON-VOLATILE MEMORY DEVICE WITH THRESHOLD VOLTAGE CONTROL FUNCTION

BACKGROUND OF THE INVENTION

1. Field of the Invention

The present invention relates to an electrically erasable and programmable non-volatile memory device. More particularly, the present invention relates to a non-volatile memory device in which a threshold voltage is controlled to relax electrical stress with respect to a memory cell transistor, thereby improving the number of rewrite operations.

2. Description of the Background Art

As electrically erasable and programmable non-volatile memory devices, EEPROM (Electrically Erasable Programmable Read Only Memory) and flash EEPROM are known, as disclosed in, for example, Japanese Patent Laid-Open Publication No. 2002-208291. FIG. 19 is a diagram illustrating a structure of a flash EEPROM described in the above-described publication. The flash EEPROM 1900 of FIG. 19 comprises a memory cell array 1910, a booster circuit 140, a regulator circuit 150, a decoder circuit 160, a read determination circuit 170, and a control circuit 180.

The memory cell array 1910 includes a plurality of memory cell transistors which are arranged in an array. Each memory cell transistor has a floating gate for accumulating electric charge so as to store data in a non-volatile manner. The memory cell transistor is subjected to a step of injecting electric charge into the floating gate (hereinafter referred to as a "write operation") and a step of releasing electric charge accumulated in the floating gate (hereinafter referred to as an "erase operation"). Hereinafter, a combination of the "erase operation" and the "write operation" is referred to as a "rewrite operation".

Among the above-described two steps with respect to a memory cell transistor, the erase operation is performed in units of a plurality of memory cell transistors which can be simultaneously selected, such as a row or column in the memory cell array 1910. A set of a plurality of memory cell transistors which can be simultaneously selected and erased in the above-described manner are referred to as an "erase unit area". The memory cell array 1910 of FIG. 19 includes n erase unit areas 121 to 12N. In addition to this, the memory cell array 1910 includes a trimming value storing area 1930 described below.

Generally, in a flash EEPROM, in order to perform an erase operation or a write operation with respect to a memory cell transistor, voltages higher than a power source voltage are required (hereinafter referred to as an "erase voltage" and a "write voltage", respectively, and both the voltages are collectively referred to as an "erase/write voltage"). To this end, the flash EEPROM 1900 includes the booster circuit 140.

In the flash EEPROM 1900, a rewrite operation is performed with respect to a memory cell transistor as follows. When the rewrite operation is performed, an address of an erase unit area 120 to be rewritten and data to be written are input via an I/O buffer (not shown). The decoder circuit 160 selects a bit line and a word line (not shown) based on the input address. As a result, the erase unit area 120 to be rewritten is selected. The booster circuit 140 boosts the power source voltage to the erase/write voltage. The trimming value storing area 1930 is a non-volatile memory area included in the memory cell array 1910, which stores an output regulating value (hereinafter referred to as a "trimming value") for the erase/write voltage. In the trimming value storing area 1930, an appropriate trimming value is previously set as an initial value. The regulator circuit 150 regulates a level of the erase/write voltage based on the trimming value stored in the trimming value storing area 1930. The read determination circuit 170 performs a determination step with respect to the threshold voltage of a memory cell transistor after performing a rewrite operation with respect to the erase unit area 120. The control circuit 180 controls each portion of the flash EEPROM 1900.

In an erase operation, an erase voltage whose level is regulated by the regulator circuit 150 is applied to the erase unit area 120 selected by the decoder circuit 160. In a memory cell transistor to which the erase voltage is applied, electric charge accumulated at the floating gate is released, so that a threshold voltage Vt thereof decreases. Such a state of the memory cell transistor is referred to as an "erased state". The erased state corresponds to a logical state in which data "1" is stored.

In a write operation, a write voltage whose level is regulated by the regulator circuit 150 is applied to the erase unit area 120 selected by the decoder circuit 160. In a memory cell transistor to which the write voltage is applied, electric charge is externally injected into the floating gate to increase the threshold voltage Vt. Such a state of the memory cell transistor is referred to as a "written state". The written state corresponds to a logical state in which data "0" is stored.

In the flash EEPROM 1900, when the write operation is repeatedly performed with respect to a memory cell transistor, characteristics of the memory cell transistor are gradually degraded, leading to a change in the threshold voltage of the memory cell transistor. FIG. 20 is a diagram illustrating a relationship between the number of rewrite operations in the flash EEPROM 1900 and the threshold voltage Vt. In FIG. 20, the horizontal axis represents the number of rewrite operations, while the vertical axis represents the threshold voltage of a memory cell transistor.

Characteristics indicated with solid lines will be first described. When a rewrite operation is repeatedly performed with respect to a memory cell transistor, a threshold voltage V0 after a write operation gradually decreases, while a threshold voltage V1 after an erase operation gradually increases, as illustrated with the solid lines in FIG. 20. When these threshold voltages depart from correct values in their respective initial states, data accumulated in the memory cell transistor can be no longer correctly read out.

To prevent such a read error, the flash EEPROM 1900 changes an erase/write voltage to a higher value than before, when detecting a degradation in the characteristics of the memory cell transistor. For example, the read determination circuit 170, when the threshold voltage V1 after an erase operation exceeds a reference voltage Vx, determines that an abnormality occurs. When the read determination circuit 170 determines that an abnormality occurs, the control circuit 180 changes the trimming value stored in the trimming value storing area 1930 to a value which causes an erase/write voltage output from the regulator circuit 150 to be higher than before.

In the example of FIG. 20, when the number of rewrite operations reaches N1, the threshold voltage V1 after an erase operation exceeds the reference voltage Vx, and it is determined that an abnormality occurs. At this time, the trimming value stored in the trimming value storing area 1930 is updated to a value which causes an erase/write voltage output from the regulator circuit 150 to be higher than before. Thereby, the erase/write voltage output from the regulator circuit 150 is caused to be higher than before, so that the threshold voltage V0 after a write operation and the threshold voltage V1 after an erase operation are restored to levels which prevent a read error.

After the number of rewrite operations exceeds N1, the threshold voltage V0 after a write operation still gradually decreases, while the threshold voltage V1 after an erase operation still gradually increases. When the number of rewrite operations eventually reaches N2, the threshold voltage V1 after an erase operation exceeds the reference voltage Vx again, so that it is determined again that an abnormality occurs. At this time, the same step as when the number of rewrite operations reaches N1 is performed, an erase/write voltage output from the regulator circuit 150 is caused to be even higher, so that the threshold voltage V0 after a write operation and the threshold voltage V1 after an erase operation are restored again to levels which prevent a read error.

By controlling the trimming value in the above-described manner, even when a rewrite operation is repeatedly performed with respect to a memory cell transistor, the apparent characteristics of the memory cell transistor are maintained to be in the same state as when the number of rewrite operations is small. Therefore, according to the flash EEPROM 1900, the number of rewrite operations can be improved.

However, a rewrite operation with respect to a memory cell transistor may not be uniformly performed for all erase unit areas, i.e., the number of rewrite operations may vary among erase unit areas. In spite of this, the above-described conventional flash EEPROM 1900 employs a single trimming value to control the threshold voltages of all memory cell transistors included in the memory cell array. Therefore, when the number of rewrite operations varies among erase unit areas, the number of rewrite operations may not be satisfactorily improved.

This point will be described with reference to the characteristics indicated with dashed lines in FIG. 20. For example, the flash EEPROM 1900 is assumed to include an erase unit area having a large number of rewrite operations and an erase unit area having a small number of rewrite operations. In this case, for the erase unit area having a large number of rewrite operations, the apparent characteristics of the memory cell transistor can be maintained to be in a satisfactory state by controlling the trimming value. However, in the flash EEPROM 1900, updating of the trimming value also has an influence on the erase unit area having a small number of rewrite operations. Therefore, for a memory cell transistor included in the erase unit area having a small number of rewrite operations, the trimming value is updated before the characteristics are not much degraded, and every time the trimming value is updated, the threshold voltage V0 after a write operation and the threshold voltage V1 after an erase operation gradually depart from appropriate values in their respective initial values (see the dashed lines in FIG. 20).

As described above, in the flash EEPROM 1900, a memory cell transistor included in the erase unit area having a small number of rewrite operations may acquire abnormal erase and write characteristics. However, when an excessive erase/write voltage is applied to a memory cell transistor, the overall amount of electricity passing through a tunnel oxide film provided below the floating gate of the memory cell transistor increases, so that an electric field higher than necessary is applied. Due to electrical stress during such a rewrite operation, the life span of a memory cell transistor included in the erase unit area having a small number of rewrite operations may be shortened.

SUMMARY OF THE INVENTION

Therefore, an object of the present invention is to provide a non-volatile memory device in which the number of rewrite operations is improved for all erase unit areas even when the number of rewrite operations varies among erase unit areas.

To achieve the object, the present invention provides an electrically erasable and programmable non-volatile memory device comprising a plurality of erase unit areas each including a plurality of non-volatile memory cell transistors which are simultaneously selected in an erase operation, a plurality of output regulating value storing sections provided corresponding to the respective erase unit areas, of storing output regulating values of the respective erase unit areas in a non-volatile manner, a voltage generating circuit of generating a voltage having a level required in an erase operation and a write operation with respect to each of the erase unit areas, a voltage regulating circuit of regulating the level of the voltage generated in the voltage generating circuit based on a corresponding one of the output regulating values provided thereto, a read determination circuit of performing determination with respect to data after an erase operation and a write operation with respect to each of the erase unit areas, and a control circuit of operating in an erase operation and a write operation with respect to each of the erase unit areas. Therefore, for an erase unit area having a large number of rewrite operations, the apparent characteristics of the memory cell transistor are maintained to be in a satisfactory state by updating the output regulating value, while for an erase unit area having a small number of rewrite operations, updating of the output regulating value can be suppressed. Therefore, even when the number of rewrite operations varies among erase unit areas, it is possible to prevent unnecessary electrical stress from being given to an erase unit area having a small number of rewrite operations, and improve the number of rewrite operations for all erase unit areas.

In this case, the read determination circuit may perform the determination step in accordance with a criterion stricter than when a read operation is performed. When performing the determination step, the read determination circuit may apply to a current detection type sense amplifier circuit a reference current which provides a criterion stricter than when a read operation is performed. Alternatively, the read determination circuit may apply to the memory cell transistor a gate voltage which provides a criterion stricter than when a read operation is performed. Thereby, a degradation in the characteristics of a memory cell transistor can be detected at an earlier stage, so that an erase operation and a write operation can be more reliably performed with respect to the memory cell transistor.

The voltage regulating circuit may include a limiter circuit of limiting an output voltage within a breakdown-voltage specification of the memory cell transistor. Thereby, even when the output voltage of the voltage regulating circuit is high, it is possible to prevent a memory cell transistor included in the erase unit area from being destroyed.

The control circuit may perform the steps of: selecting one of the erase unit areas, providing to the voltage regulating circuit the output regulating value stored in the output regulating value storing section corresponding to the selected erase unit area, and performing a control so that, when the read determination circuit detects an abnormality as a result of the determination step after an erase operation and a write operation are performed with respect to the selected erase unit area, the output regulating value stored in the output regulating value storing section corresponding to the selected erase unit area is updated to a value which causes an output voltage to be higher than before, and thereafter, an erase operation and a write operation are performed again with respect to the selected erase unit area. Particularly, every time the output regulating value stored in the output regulating value storing section is updated, the control circuit may perform a write operation after an erase operation with respect to the output regulating value storing section. Alternatively, when the output regulating value stored in the output regulating value storing section is updated for the first time, the control circuit may perform a write operation after an erase operation with respect to the output regulating value storing section, and when the output regulating value stored in the output regulating value storing section is updated for the second time and thereafter, the control circuit may perform a write operation without an erase operation with respect to the output regulating value storing section. In the latter case, the voltage regulating circuit preferably outputs voltages different from each other by a value selected in a range of 0.1 to 0.4 V, depending on the number of bits having a predetermined value in the provided output regulating value. Thereby, a time required to erase an output regulating value is caused to be unnecessary, resulting in a reduction in rewrite time.

The non-volatile memory device may further comprise an output regulating value temporarily holding circuit of temporarily storing the output regulating value to be provided to the voltage regulating circuit. In this case, the control circuit preferably performs the steps of selecting one of the erase unit areas, providing to the voltage regulating circuit the output regulating value stored in the output regulating value storing section corresponding to the selected erase unit area, performing a control so that, when the read determination circuit detects an abnormality as a result of the determination step after an erase operation and a write operation are performed with respect to the selected erase unit area, an output regulating value which causes an output voltage to be higher than before is set in the output regulating value temporarily holding circuit and the set output regulating value is provided to the voltage regulating circuit, and thereafter, an erase operation and a write operation are performed again with respect to the selected erase unit area, and setting the output regulating value stored in the output regulating value temporarily holding circuit into the output regulating value storing section corresponding to the selected erase unit area after the erase operation and the write operation are normally performed with respect to the selected erase unit area. Thereby, a time required to erase an output regulating value is caused to be unnecessary, resulting in a reduction in rewrite time.

In addition, the non-volatile memory device may further comprise an error flag circuit of temporarily storing a result of the determination step performed by the read determination circuit. In this case, the control circuit preferably performs setting the output regulating value stored in the output regulating value temporarily holding circuit into the output regulating value storing section corresponding to the selected erase unit area only when an abnormality is stored in the error flag circuit after an erase operation and an write operation are normally performed with respect to the selected erase unit area. Thereby, a rewrite time when an output regulating value is not updated can be further reduced.

The non-volatile memory device may further comprise a plurality of monitor bits provided corresponding to the respective erase unit areas and each composed of a memory cell transistor of the same type as that of the erase unit area, in which an erase operation may be performed with respect to the monitor bit when an erase operation is performed with respect to the corresponding erase unit area, and a write operation may be performed with respect to the monitor bit when a write operation is performed with respect to all or a portion of the memory cell transistors included in the corresponding erase unit area. In this case, the control circuit performs the steps of selecting one of the erase unit areas, providing to the voltage regulating circuit the output regulating value stored in the output regulating value storing section corresponding to the selected erase unit area, performing a control so that, when the read determination circuit detects an abnormality as a result of the determination step after an erase operation and a write operation are performed with respect to the selected erase unit area, an output regulating value which causes an output voltage to be higher than before is provided to the voltage regulating circuit, and thereafter, an erase operation and a write operation are performed again with respect to the selected erase unit area, and the read determination circuit performs the determination step with respect to the monitor bit corresponding to the selected erase unit area. Thereby, the read determination circuit can detect an abnormality at an earlier stage, so that the output voltage of the voltage regulating circuit can be regulated to a high level at an earlier stage, thereby making it possible to more reliably perform an erase operation and a write operation with respect to the memory cell transistor.

The non-volatile memory device may further comprise a data latch circuit of temporarily storing a plurality of output regulating values to be set in the output regulating value storing section. In this case, the control circuit preferably performs the steps of selecting one of the erase unit areas, providing to the voltage regulating circuit the output regulating value stored in the output regulating value storing section corresponding to the selected erase unit area, performing a control so that, when the read determination circuit detects an abnormality as a result of the determination step after an erase operation and a write operation are performed with respect to the selected erase unit area, an output regulating value which causes an output voltage to be higher than before is provided to the voltage regulating circuit, and thereafter, an erase operation and a write operation are performed again with respect to the selected erase unit area, setting into the data latch circuit the output regulating value provided to the voltage regulating circuit when an erase operation and a write operation have been normally performed with respect to the selected erase unit area, and setting the plurality of output regulating values stored in the data latch circuit into the output regulating value storing section after an erase operation and a write operation are normally performed with respect to all of the erase unit areas. Thereby, the number of write operations with respect to the output regulating value storing section can be reduced, so that a time required to update the output regulating value is reduced and a degradation in the memory cell transistor included in the output regulating value storing section is suppressed, thereby making it possible to improve the number of rewrite operations of the memory cell transistor.

The non-volatile memory device may further comprise a fixed output regulating value storing section of storing a fixed output regulating value to be provided to the voltage regulating circuit. In this case, the control circuit preferably performs the steps of selecting one of the erase unit areas, providing to the voltage regulating circuit the output regulating value stored in the output regulating value storing section corresponding to the selected erase unit area, and performing a control so that, when the read determination circuit detects an abnormality as a result of the determination step after an erase operation and a write operation are performed with respect to the selected erase unit area, an output regulating value which causes an output voltage to be higher than before is provided to the voltage regulating circuit, and thereafter, an erase operation and a write operation are performed again with respect to the selected erase unit area. One of the erase operation and the write operation with respect to the erase unit area is preferably performed while the output regulating value stored in the fixed output regulating value storing section is provided to the voltage regulating circuit. Particularly, one of the erase operation and the write operation with respect to the erase unit area, the one having a smaller influence on a change in characteristics of the memory cell transistor, is more preferably performed while the output regulating value stored in the fixed output regulating value storing section is provided to the voltage regulating circuit. Thereby, when there is a memory cell transistor whose post-write operation threshold voltage does not change much even if the number of rewrite operations is increased, the number of rewrite operations can be increased for all of the erase unit areas.

In the non-volatile memory device comprising the monitor bits, when an erase operation and a write operation are performed with respect to the selected erase unit area for the first time, the control circuit may update the output regulating value to be provided to the voltage regulating circuit, depending on a result of the determination step with respect to all data included in the selected erase unit area, and when an erase operation and a write operation are performed with respect to the selected erase unit area for the second time and thereafter, the control circuit may update the output regulating value to be provided to the voltage regulating circuit, depending on a result of the determination step with respect to the monitor bit corresponding to the selected erase unit area. Thereby, even when the number of rewrite operations varies among erase unit areas, the number of rewrite operations is improved for all of the erase unit areas without being affected by such a variation. Alternatively, when an erase operation and a write operation are performed with respect to the selected erase unit area for the second time and thereafter, the control circuit may perform a control so that an output regulating value when an erase operation and a write operation have been normally performed with respect to the selected erase unit area is provided to the voltage regulating circuit, and thereafter, an erase operation and a write operation are preformed again with respect to the selected erase unit area. Thereby, it is possible to more reliably perform an erase operation and a write operation with respect to the memory cell transistor.

The non-volatile memory device may further comprise a busy circuit of outputting a busy signal indicating that an erase operation and a write operation are being performed with respect to one of the erase unit area and the output regulating value storing section. Thereby, the external controllability of the non-volatile memory device can be enhanced.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
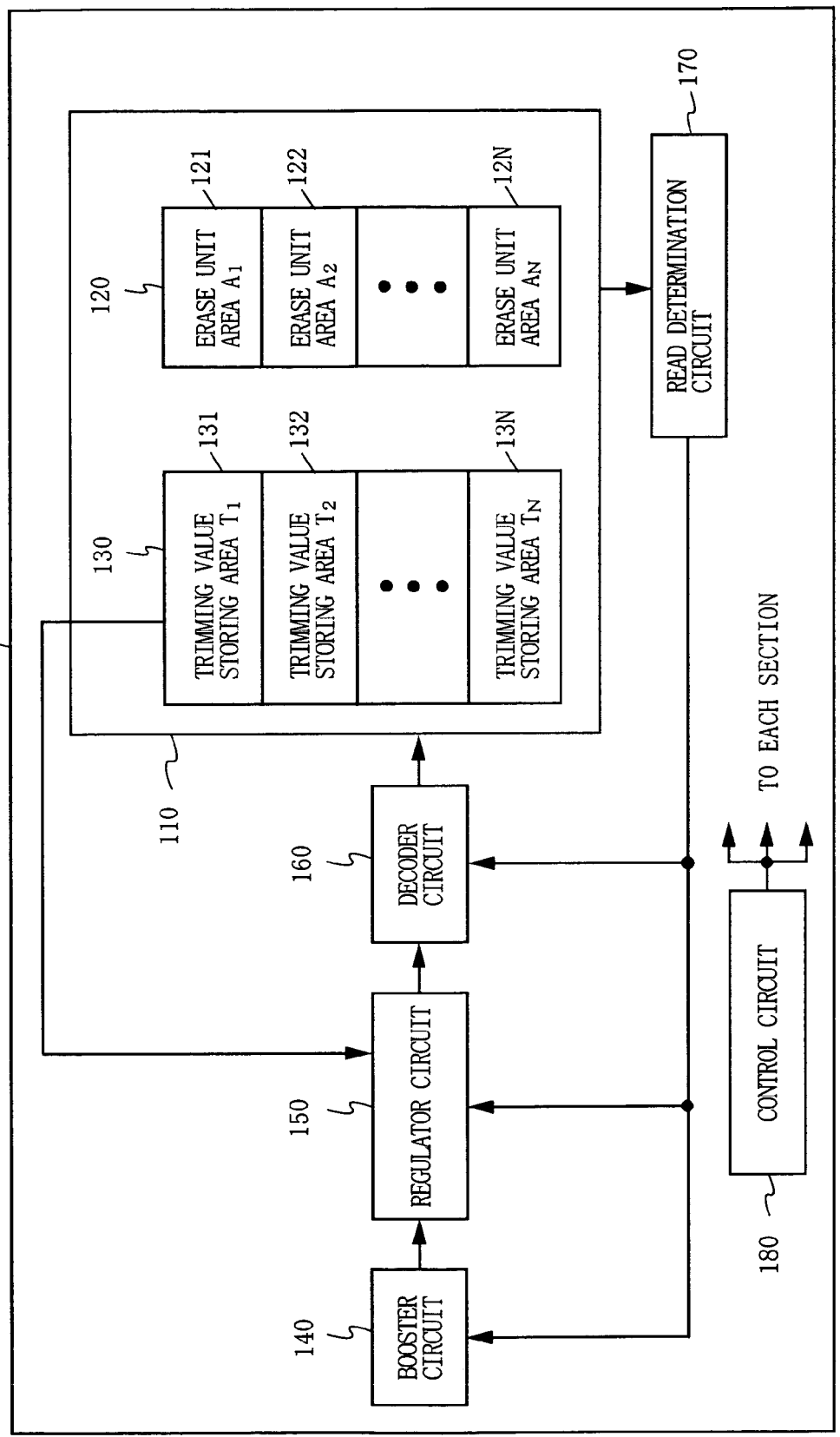
FIG. 1 is a diagram illustrating a structure of a flash EEPROM according to a first embodiment of the present invention.

Hereinafter, embodiments of the present invention will be described with reference to the accompanying drawings. In the drawings, like reference characters generally refer to the same parts throughout the different views and will not be herein repeatedly explained. Also, like step numbers generally refer to the same steps throughout the different flowcharts and will not be herein repeatedly explained.

First Embodiment

FIG. 1 is a diagram illustrating a structure of a flash EEPROM according to a first embodiment of the present invention. The flash EEPROM 100 of FIG. 1 comprises a memory cell array 110, a booster circuit 140, a regulator circuit 150, a decoder circuit 160, a read determination circuit 170, and a control circuit 180. The memory cell array 110 includes N erase unit areas 121 to 12N, and N trimming value storing areas 131 to 13N. Among these components, the booster circuit 140 functions as a voltage generating circuit, the regulator circuit 150 functions as a voltage regulating circuit, and the trimming value storing areas 131 to 13N function as output regulating value storing sections.

The memory cell array 110 includes a plurality of memory cell transistors arranged in an array. Each memory cell transistor has a floating gate for accumulating electric charge so as to store data in a non-volatile manner. The memory cell transistor is subjected to a step of injecting electric charge into the floating gate (hereinafter referred to as a "write operation") and a step of releasing electric charge accumulated in the floating gate (hereinafter referred to as an "erase operation").

The erase unit areas 121 to 12N are each a set of a plurality of memory cell transistors which can be simultaneously selected and erased. The trimming value storing areas 131 to 13N are provided, corresponding to the respective erase unit areas 121 to 12N, and store trimming values (output regulating values for erase/write voltages) for the corresponding respective erase unit areas in a non-volatile manner. For example, the trimming value storing area 131 stores a trimming value $T_1$ for the erase unit area 121, and a trimming value storing area 132 stores a trimming value $T_2$ for the erase unit area 122. Initial values of the trimming values $T_1$ to $T_N$ stored in the trimming value storing areas 131 to 13N are set to be values appropriate for, for example, a shipment testing step of the flash EEPROM 100.

In the flash EEPROM 100, a memory cell transistor included in an i-th erase unit area (i is an integer of 1 or more and N or less) is rewritten as follows. When a rewrite operation is performed, an address of the i-th erase unit area 120 and data to be written are input via an I/O buffer (not shown). The decoder circuit 160 selects a bit line and a word line (not shown) based on the input address. Thereby, the i-th erase unit area 120 and its corresponding i-th trimming value storing area 130 are selected. The booster circuit 140 boosts a power source voltage to an erase/write voltage. The regulator circuit 150 regulates a level of the erase/write voltage based on the trimming value $T_i$ stored in the i-th trimming value storing area 130. The read determination circuit 170 performs a determination step with respect to the threshold voltage of a memory cell transistor after a rewrite operation with respect to the i-th erase unit area 120. The control circuit 180 controls each section of the flash EEPROM 100.

Figure 2:
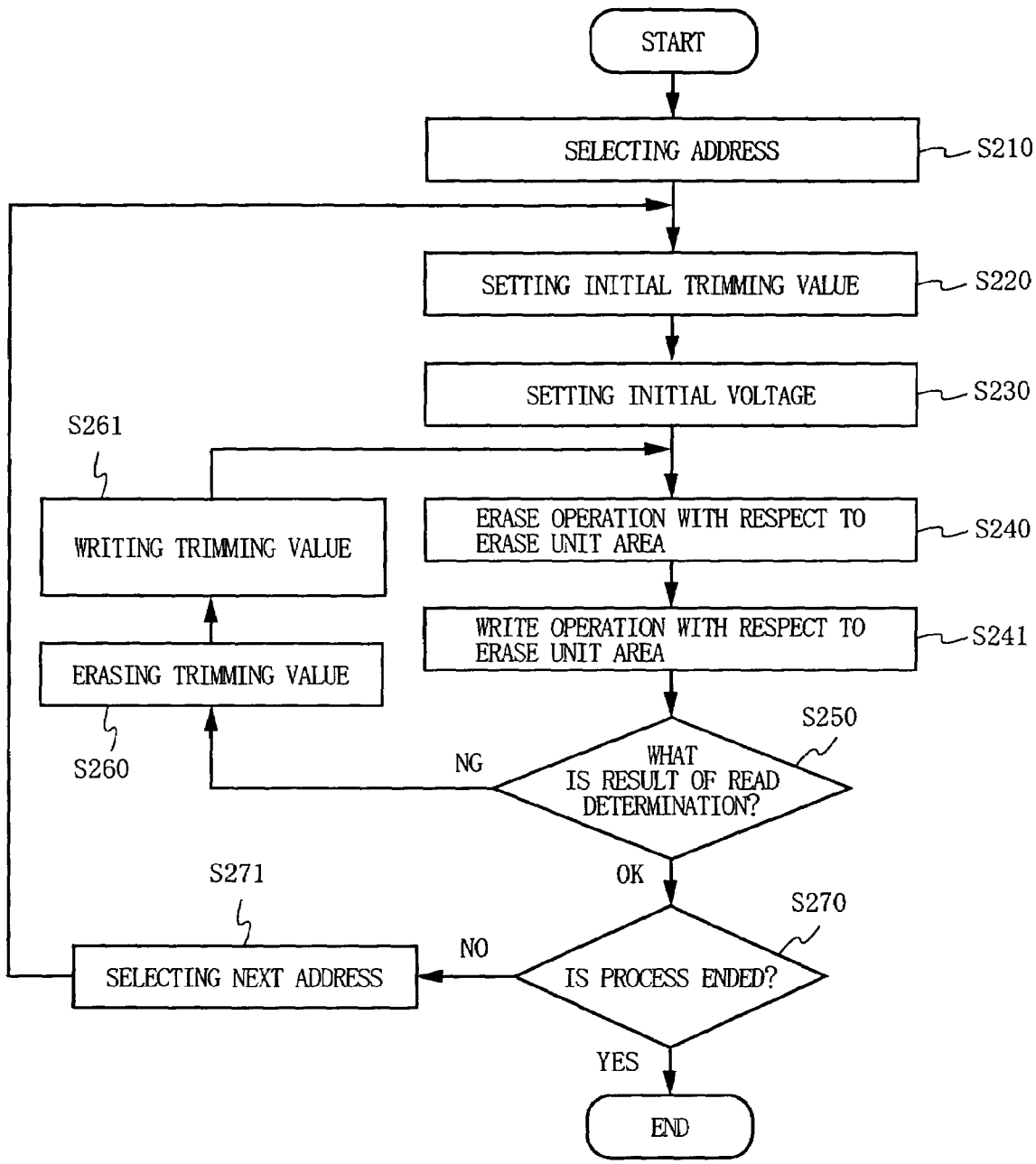
FIG. 2 is a flowchart illustrating a rewrite operation with respect to the flash EEPROM of the first embodiment of the present invention.

FIG. 2 is a flowchart illustrating a rewrite operation with respect to the flash EEPROM 100. When the rewrite operation is performed, the flash EEPROM 100 selects an address based on an input address (step S210). More specifically, in step S210, the decoder circuit 160 selects a bit line and a word line based on an address input via an I/O buffer. Thereby, an erase unit area 120 to be written is selected, and along with this, a trimming value storing area 130 corresponding to the selected erase unit area 120 is selected.

Next, the flash EEPROM 100 sets an initial trimming value (step S220). More specifically, in step S220, the control circuit 180 performs a control so that a trimming value stored in the trimming value storing area 130 selected in step S210 (or in step S271 described below) is supplied to the regulator circuit 150. For example, when the i-th erase unit area 120 is selected in step S210, after step S220 the regulator circuit 150 is given the trimming value $T_i$ stored in the i-th trimming value storing area 130 corresponding to the i-th erase unit area 120.

Next, the flash EEPROM 100 sets an initial value of a voltage to be supplied to the memory cell array 110 (step S230). More specifically, in step S230, the control circuit 180 controls the booster circuit 140 to be activated. Thereby, after step S230 is performed, the booster circuit 140 boosts the power source voltage to the erase/write voltage, and the regulator circuit 150 regulates the level of the erase/write voltage based on the input trimming value, and the level-regulated erase/write voltage is supplied to the selected erase unit area 120 via the decoder circuit 160.

For example, when the i-th erase unit area 120 is selected in step S210, after step S230 the erase/write voltage whose level is regulated using the trimming value $T_i$ stored in the i-th trimming value storing area 130 is supplied to the i-th erase unit area 120. Hereinafter, the erase voltage and the write voltage whose levels are regulated by the regulator circuit 150 are referred to as a post-regulation erase voltage and a post-regulation write voltage, respectively, and are collectively referred to as a post-regulation erase/write voltage.

Next, the flash EEPROM 100 performs an erase operation with respect to the erase unit area 120 selected in step S210 or the like (step S240). More specifically, in step S240, the post-regulation erase voltage is applied to the erase unit area 120 selected in step S210 or the like. Thereby, in each memory cell transistor included in the selected erase unit area 120, electric charge accumulated in the floating gate is released, so that the threshold voltage Vt decreases. Therefore, all of the memory cell transistors included in the selected erase unit area are brought into an erased state (data "1" is stored)

Next, the flash EEPROM 100 performs a write operation with respect to the erase unit area 120 selected in step S210 (step S241). More specifically, in step S240, the post-regulation write voltage is applied to the erase unit area 120 selected in step S210 or the like, and memory cell transistor (s) to which data "0" is to be written are successively selected. Thereby, among the memory cell transistors included in the selected erase unit area 120, electric charge is externally injected into the floating gate of a memory cell transistor(s) to which data "0" is to be written, so that the threshold voltage Vt thereof increases. Therefore, a portion of the memory cell transistors included in the selected erase unit area 120 is brought into a written state (data "0" is stored). After steps S240 and S241 are performed, the selected erase unit area 120 is brought into a state in which data arbitrarily including "0" (s) and "1" (s) are stored.

Next, in the flash EEPROM 100, read determination is performed with respect to the erase unit area 120 selected in step S210 or the like (step S250). More specifically, in step S250, the read determination circuit 170 examines, concerning the erase unit area 120 selected in step S210 or the like, whether or not the threshold voltage of a memory cell transistor in the erased state (hereinafter referred to as a "post-erase operation threshold voltage V1") or the threshold voltage of a memory cell transistor in the written state (hereinafter referred to as a "post-write operation threshold voltage V0") satisfies a predetermined criterion. The read determination circuit 170 determines that an abnormality does not occur when the criterion is satisfied, and that an abnormality occurs when the criterion is not satisfied.

For example, the read determination circuit 170 may have a reference voltage Vx with respect to the post-erase operation threshold voltage V1, and when an actual value of the post-erase operation threshold voltage V1 exceeds the reference voltage Vx, determines that an abnormality occurs. Alternatively, the read determination circuit 170 may have a reference voltage Vy with respect to the post-write operation threshold voltage V0, and when an actual value of the post-erase operation threshold voltage V1 is lower than the reference voltage Vy, determine that an abnormality occurs. Alternatively, the read determination circuit 170 has the reference voltages Vx and Vy, and when an actual value of the post-erase operation threshold voltage V1 exceeds the reference voltage Vx or when an actual value of the post-erase operation threshold voltage V1 is lower than the reference voltage Vy, determines that an abnormality occurs.

The read determination circuit 170 may examine whether or not the above-described criterion is satisfied for all or a portion of the memory cell transistors included in the selected erase unit area 120.

When it is determined as a result of read determination that an abnormality occurs (NG in step S250), the flash EEPROM 100 erases the trimming value for the erase unit area 120 selected in step S210 or the like (step S260), and writes a new trimming value for the selected erase unit area 120 (step S261). More specifically, when the i-th erase unit area 120 is selected in step S210 or the like, a post-regulation erase voltage is applied to the i-th trimming value storing area 130 in step S260. Thereby, the i-th trimming value storing area 130 stores a trimming value all bits of which are "1". Next, in step S261, a post-regulation write voltage is applied to the i-th trimming value storing area 130, so that a memory cell transistor(s) to which data "0" is to be written is selected as appropriate. Thereby, the i-th trimming value storing area 130 is brought into a state in which a new trimming value arbitrarily including "0" (s) and "1" (s) is stored.

In step S261, as the new trimming value, a trimming value which causes a post-regulation erase/write voltage to be higher than before is set. For example, when the regulator circuit 150 is constructed to output a higher voltage as an input trimming value is increased, the new trimming value is set to be higher than before in step S261. Conversely, when the regulator circuit 150 is constructed to output a lower voltage as an input trimming value is increased, the new trimming value is set to be smaller than before in step S261. Thereby, after step S261 is performed, a post-regulation erase/write voltage higher than before is applied to the erase unit area 120 selected in step S210 or the like.

After step S261, the control of the write operation goes to step S240. Thereafter, the flash EEPROM 100 repeatedly performs the steps of erasing a trimming value, writing a trimming value, erasing data from an erase unit area, and writing data to an erase unit area until it is determined in step S250 that an abnormality does not occur.

At the time when it is determined in step S250 that an abnormality does not occur (OK in step S250), the flash EEPROM 100 ends the rewrite operation with respect to the erase unit area 120 selected in step S210 or the like and the update step with respect to a trimming value stored in a trimming value storing area 130 corresponding to the selected erase unit area 120. Next, the flash EEPROM 100 determines whether or not to end the process (step S270). More specifically, in step S270, the control circuit 180 examines whether or not there is a remaining erase unit area to be rewritten, and when there is a remaining erase unit area to be rewritten, determines that the process is continued, or when there is not a remaining erase unit area to be rewritten, determines that the process is ended.

When determining that the process is continued (NO in step S270), the flash EEPROM 100 selects the next address (step S271). More specifically, in step S271, the decoder circuit 160 selects a bit line and a word line based on the next address thus input. Thereby, the next erase unit area 120 to be rewritten is selected, and along with this, a trimming value storing area 130 corresponding to the selected erase unit area is selected.

After step S271, the control of the write operation goes to step S220. Thereafter, the flash EEPROM 100 repeatedly performs the steps of selecting the next address, and performing steps S220 to S261 with respect to the selected address until it is determined in step S270 that the process is ended. When it is determined in step S270 that the process is ended (YES in step S270), the flash EEPROM 100 ends the rewrite operation.

When the process of FIG. 2 is performed, the trimming value stored in the trimming value storing area 130 may or may not be updated. In either case, the trimming value storing area 130 stores the trimming value in a non-volatile manner. Therefore, a trimming value for a certain erase unit area 120 is not updated until the next rewrite operation is performed with respect to the erase unit area 120. In the next rewrite operation, the trimming value stored in the trimming value storing area 130 is used as an initial trimming value in step S220. Thus, by performing a write operation using the previously obtained trimming value as an initial value, a time required to erase and write a trimming value can be reduced.

As described above, the flash EEPROM of the first embodiment comprises a trimming value storing area for storing a trimming value for each erase unit area, and when a rewrite operation is performed with respect to a certain erase unit area, an erase/write voltage whose level is regulated using a trimming value corresponding to the erase unit area is applied. Thereby, for an erase unit area having a large number of rewrite operations, the apparent characteristics of a memory cell transistor is maintained to be in a satisfactory state by updating the trimming value, while for an erase unit area having a small number of rewrite operations, updating of the trimming value can be suppressed. Therefore, even when the number of rewrite operations varies among erase unit areas, it is possible to prevent unnecessary electrical stress from being given to an erase unit area having a small number of rewrite operations, and improve the number of rewrite operations for all erase unit areas. Therefore, the flash EEPROM of the first embodiment is particularly useful for memories for IC cards and the like, which require frequent rewrite operations.

In the foregoing description, in step S250, the read determination circuit 170 is assumed to perform read determination using the reference voltage Vx or the like for the post-erase operation threshold voltage V1. Alternatively, other criteria may be used. Particularly if the read determination circuit 170 performs read determination in accordance with a criterion stricter than that of an ordinary read operation, a degradation in characteristics of a memory cell transistor can be detected earlier, so that a rewrite operation can be more reliably performed with respect to an erase unit area.

For example, the flash EEPROM may determine the post-erase operation threshold voltage V1 after applying to a current detection type sense amplifier circuit included in the read determination circuit 170 a larger reference current than that of an ordinary read operation. In this case, a read current during read determination is reduced as compared to during the ordinary read operation. Therefore, in accordance with the criterion stricter than that of the ordinary read operation is performed, it is possible to detect, at an earlier stage, the characteristics degradation that the post-erase operation threshold voltage V1 does not sufficiently decrease.

Alternatively, the flash EEPROM may determine the post-write operation threshold voltage V0 after a gate voltage higher than when an ordinary read operation is performed is applied to a gate terminal of a memory cell transistor to be read. In this case, a read current during read determination increases as compared to when the ordinary read operation is performed. Therefore, in accordance with the criterion stricter than when the ordinary read operation is performed, it is possible to detect, at an earlier stage, the characteristics degradation that the post-write operation threshold voltage V0 does not sufficiently increase.

Second Embodiment

Figure 3:
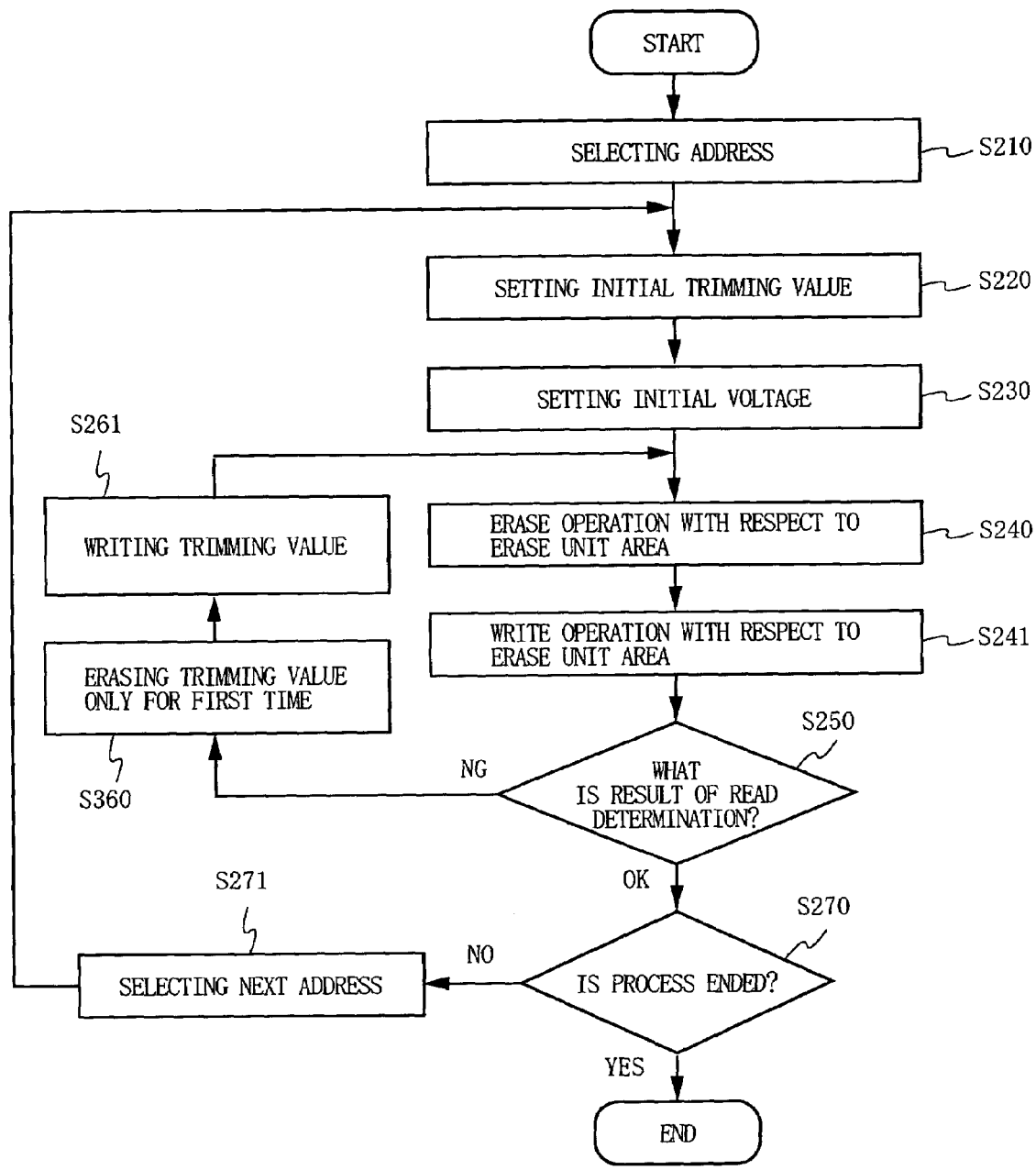
FIG. 3 is a flowchart illustrating a rewrite operation with respect to a flash EEPROM according to a second embodiment of the present invention.

A flash EEPROM according to a second embodiment of the present invention has the same structure as that of the first embodiment (see FIG. 1). FIG. 3 is a flowchart illustrating a rewrite operation in the flash EEPROM of the second embodiment. This flowchart is obtained by replacing step S260 with step S360 in the flowchart of FIG. 2.

The flash EEPROM of the second embodiment is different from the flash EEPROM of the first embodiment in the following. In the flash EEPROM of the second embodiment, the regulator circuit 150 outputs a higher level of post-regulation erase/write voltage as the number of "0"s included in an input trimming value is increased.

In the flash EEPROM of the first embodiment, a trimming value is erased in step S260. By contrast, in the flash EEPROM of the second embodiment, a trimming value is erased only in the first performance of step S360 (i.e., only when step S360 is performed for the first time with respect to a selected trimming value) as illustrated in FIG. 3. Therefore, when the control of a rewrite operation with respect to an erase unit area reaches step S360 for the first time, the step of erasing a trimming value is performed. However, when the control of the rewrite operation reaches step S360 for the second time and thereafter, no step is performed. As a result, all bits of the trimming value are initially set to be "1", and thereafter, each bit is changed only from "1" to "0". For example, when a trimming value has a size of 8 bits, the number of "0" included in the trimming value monotonically increases from 0 (initial state) to 1, 2, 3, . . . .

In flash EEPROMs, an erase operation is performed for each erase unit area, and therefore, the erase operation takes a longer time than that of a write operation. For example, in a typical flash EEPROM, a time required to erase one erase unit area is as long as several milliseconds. Therefore, if a trimming value is erased every time the trimming value is updated as in the flash EEPROM of the first embodiment, a time required to perform a rewrite operation with respect to an erase unit area becomes long.

To avoid this, in the flash EEPROM of the second embodiment, a trimming value is erased when the trimming value is updated for the first time, however, when the trimming value is updated for the second time and thereafter, the trimming value is not erased and "1" included in the trimming value is only changed to "0" (only a write operation is performed). As described above, the regulator circuit 150 outputs a higher level of post-regulation erase/write voltage with an increase in the number of "0"s included in an input trimming value. Therefore, as the number of "0"s included in a trimming value is increased by performing step S261, the post-regulation erase/write voltage output by the regulator circuit 150 becomes higher than before.

As described above, according to the flash EEPROM of the second embodiment, a trimming value is not erased when the trimming value is updated for the second time and thereafter. Therefore, in addition to the effect of improving the number of rewrite operations for all erase unit areas, a time required to erase a trimming value (e.g., several milliseconds) is caused to be unnecessary, resulting in a reduction in rewrite time.

In the flash EEPROM of the second embodiment, an increase in a post-regulation erase/write voltage when the number of "0"s included in a trimming value is increased by one (hereinafter simply referred to as an "increment"), is preferably selected in the range of about 0.1 to 0.4 V. When the increment is smaller than 0.1 V (e.g., several tens of millivolts), the number of bits required to store a trimming value increases. However, it is practically difficult to control the post-regulation erase/write voltage in units of several tens of millivolts, because of, for example, an error in read determination performed by the read determination circuit 170. Thus, the increase of the number of bits required to store a trimming value cannot be expected to have a commensurate effect, and therefore, the increment is preferably about 0.1 V or more. On the other hand, assuming that the increment is larger than 0.4 V (e.g., 0.5 V), when a post-regulation erase/write voltage is increased in a stepwise manner, the number of the steps is not sufficient so that the number of rewrite operations cannot be improved for all erase unit areas. Therefore, the increment is preferably about 0.4 V or less.

The regulator circuit 150 may further include a limiter circuit which limits an output voltage within the breakdown-voltage specification of a high breakdown-voltage transistor. By providing such a limiter circuit, it is possible to prevent a memory cell transistor included in an erase unit area from being destroyed even when a post-regulation erase/write voltage is high.

Third Embodiment

Figure 4:
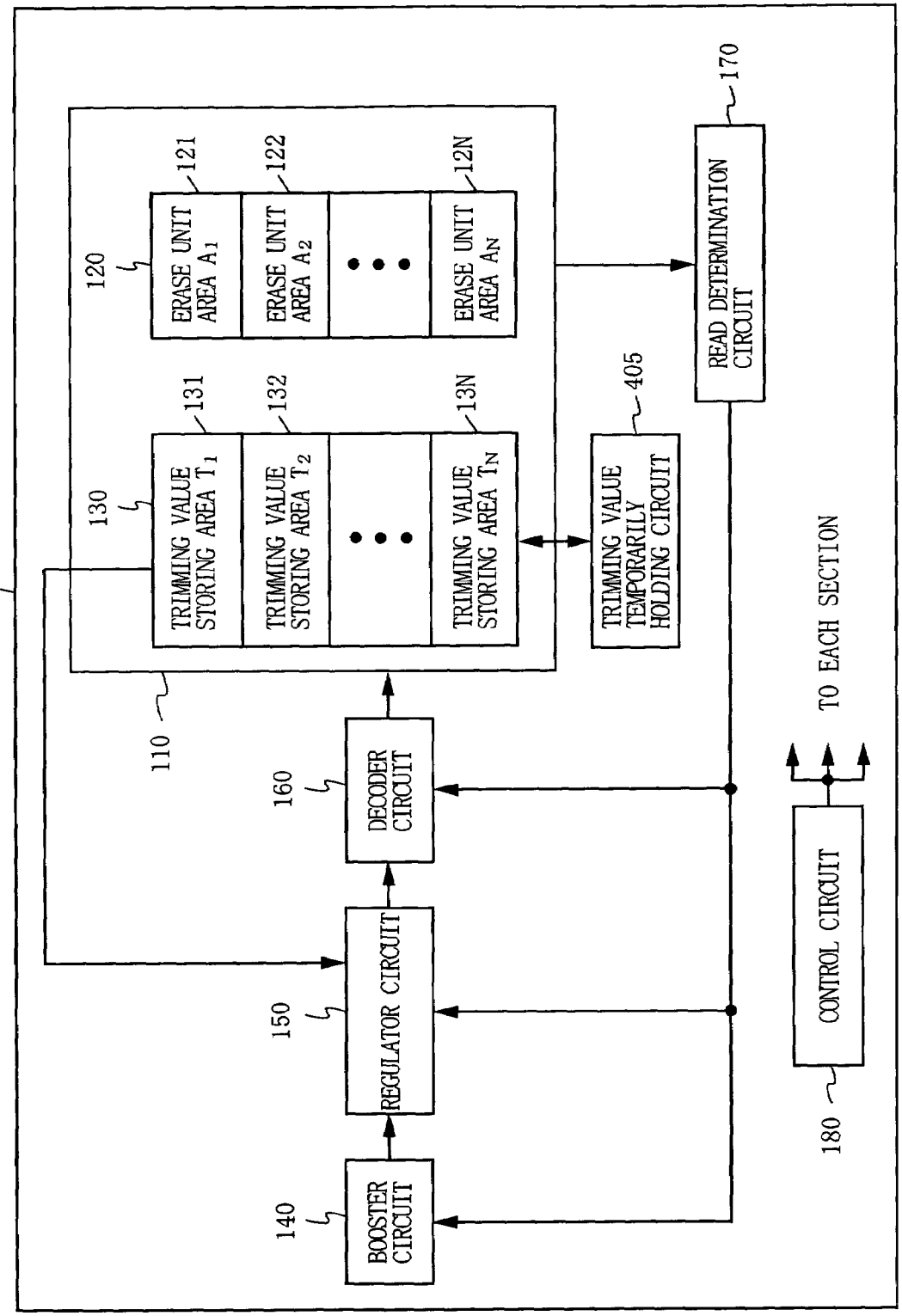
FIG. 4 is a diagram illustrating a structure of a flash EEPROM according to a third embodiment of the present invention.
Figure 5:
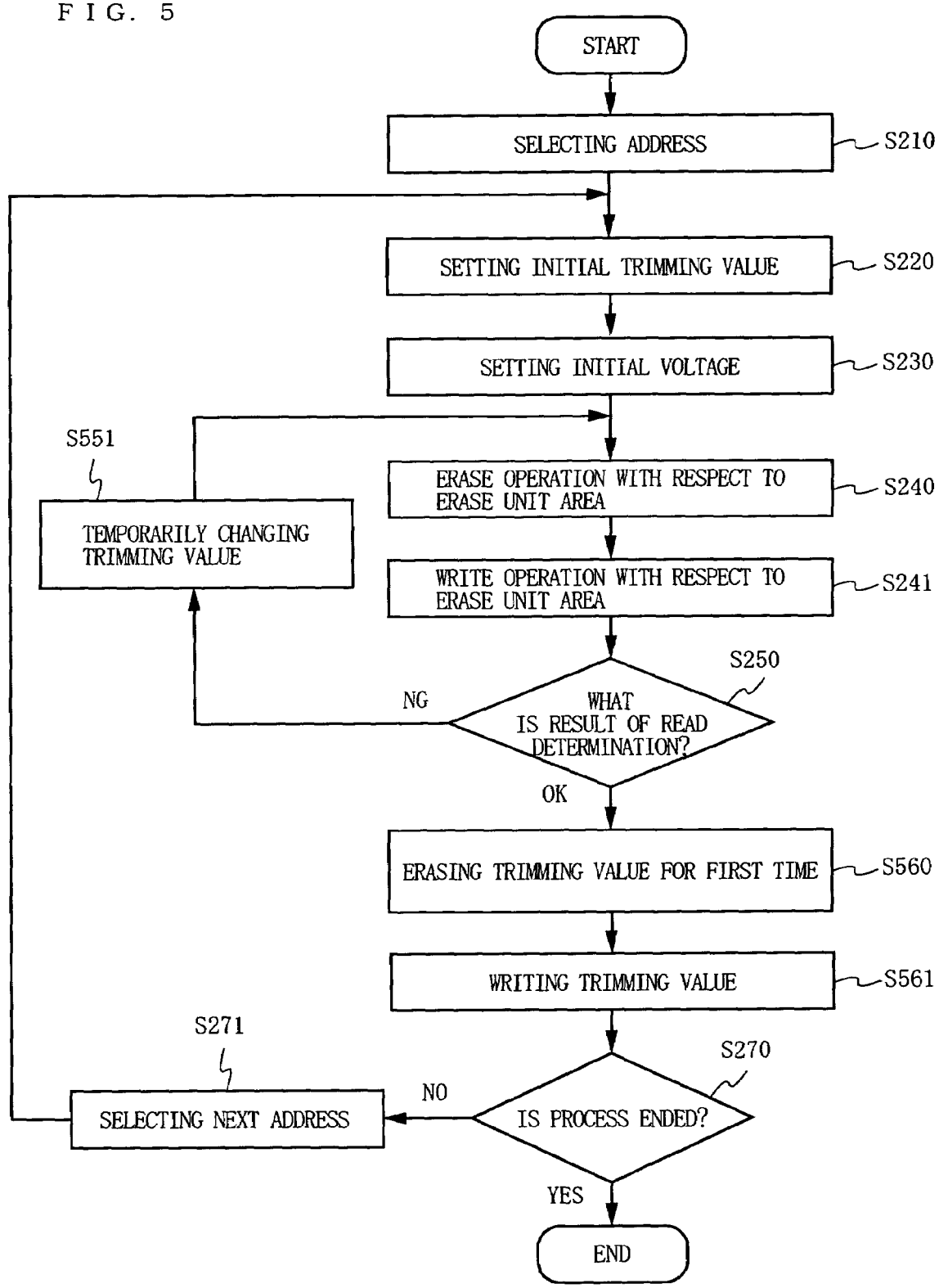
FIG. 5 is a flowchart illustrating a rewrite operation with respect to the flash EEPROM of the third embodiment of the present invention.

FIG. 4 is a diagram illustrating a structure of a flash EEPROM according to a third embodiment of the present invention. The flash EEPROM 400 of FIG. 4 is obtained by adding a trimming value temporarily holding circuit 405 to the flash EEPROM of the second embodiment. FIG. 5 is a flowchart illustrating a rewrite operation in the flash EEPROM 400 of the third embodiment. This flowchart is obtained by shifting steps S260 and S361 of the flowchart of FIG. 3 to steps S560 and S561, and adding step S551 to the original positions of steps S260 and S361.

The flash EEPROM of the third embodiment is different from the flash EEPROM of the second embodiment in the following. The flash EEPROM 400 of the third embodiment comprises the trimming value temporarily holding circuit 405 in addition to the components of the flash EEPROM of the second embodiment. The trimming value temporarily holding circuit 405 is a volatile memory section composed of, for example, a CMOS circuit or the like. The trimming value temporarily holding circuit 405 temporarily stores a temporarily set trimming value (hereinafter referred to as a "temporary trimming value") when it is determined as a result of read determination that an abnormality occurs.

In the flash EEPROM of the second embodiment, when it is determined as a result of read determination that an abnormality occurs, a trimming value is deleted only for the first time (step S360) and a new trimming value is written (step S261). By contrast, in the flash EEPROM 400 of the third embodiment, when it is determined as a result of read determination that an abnormality occurs, the temporary trimming value held in the trimming value temporarily holding circuit 405 is changed (step S551), and when it is determined as a result of read determination that an abnormality does not occur, a trimming value is erased only for the first time (step S560), and a new trimming value is written (step S561), as illustrated in FIG. 5.

More specifically, when performing step S551 with respect to an erase unit area 120 selected in step S210 or the like for the first time, the control circuit 180 sets an initial temporary trimming value into the trimming value temporarily holding circuit 405, and thereafter, performs a control so that the temporary trimming value held in the trimming value temporarily holding circuit 405 is supplied to the regulator circuit 150. As the initial temporary trimming value, a trimming value for the erase unit area 120 selected in step S210 or the like (this value is stored in the corresponding trimming value storing area 130) is preferably used, or alternatively, other values may be used (e.g., a value all bits of which are "1").

When performing step S551 with respect to the erase unit area 120 selected in step S210 or the like for the second time and thereafter, the control circuit 180 reads out the temporary trimming value held in the trimming value temporarily holding circuit 405 and sets, into the trimming value temporarily holding circuit 405, a temporary trimming value which causes a post-regulation erase/write voltage to be higher than that when the temporary trimming value is used.

Thereby, after step S551 is performed with respect to the erase unit area 120 selected in step S210 or the like for the first time, an erase/write voltage whose level is regulated using the temporary trimming value held in the trimming value temporarily holding circuit 405 is supplied to the selected the erase unit area 120. Thereafter, the flash EEPROM 400 repeatedly performs the steps of updating a temporary trimming value, erasing data with respect to an erase unit area, and writing data to the erase unit area until it is determined as a result of read determination that an abnormality does not occur.

In the flash EEPROM 400, when it is determined as a result of read determination that an abnormality does not occur (OK in step S250), the step of erasing a trimming value only for the first time (step S560) and the step of writing a new trimming value (step S561) are performed. The details of steps S560 and S561 are the same as those of steps S360 and S261 in the flowchart of FIG. 3.

As described above, in the flash EEPROM of the third embodiment, a temporary trimming value is held in a trimming value temporarily holding circuit which can be accessed with higher speed than that of a trimming value storing area, and a temporary trimming value when a rewrite operation is normally ended is written into the trimming value storing area. Thereby, in addition to the effect of improving the number of rewrite operations for all erase unit areas, a time required to erase a trimming value (e.g., several tens of milliseconds) is no longer required, thereby making it possible to reduce a rewrite time.

Fourth Embodiment

Figure 6:
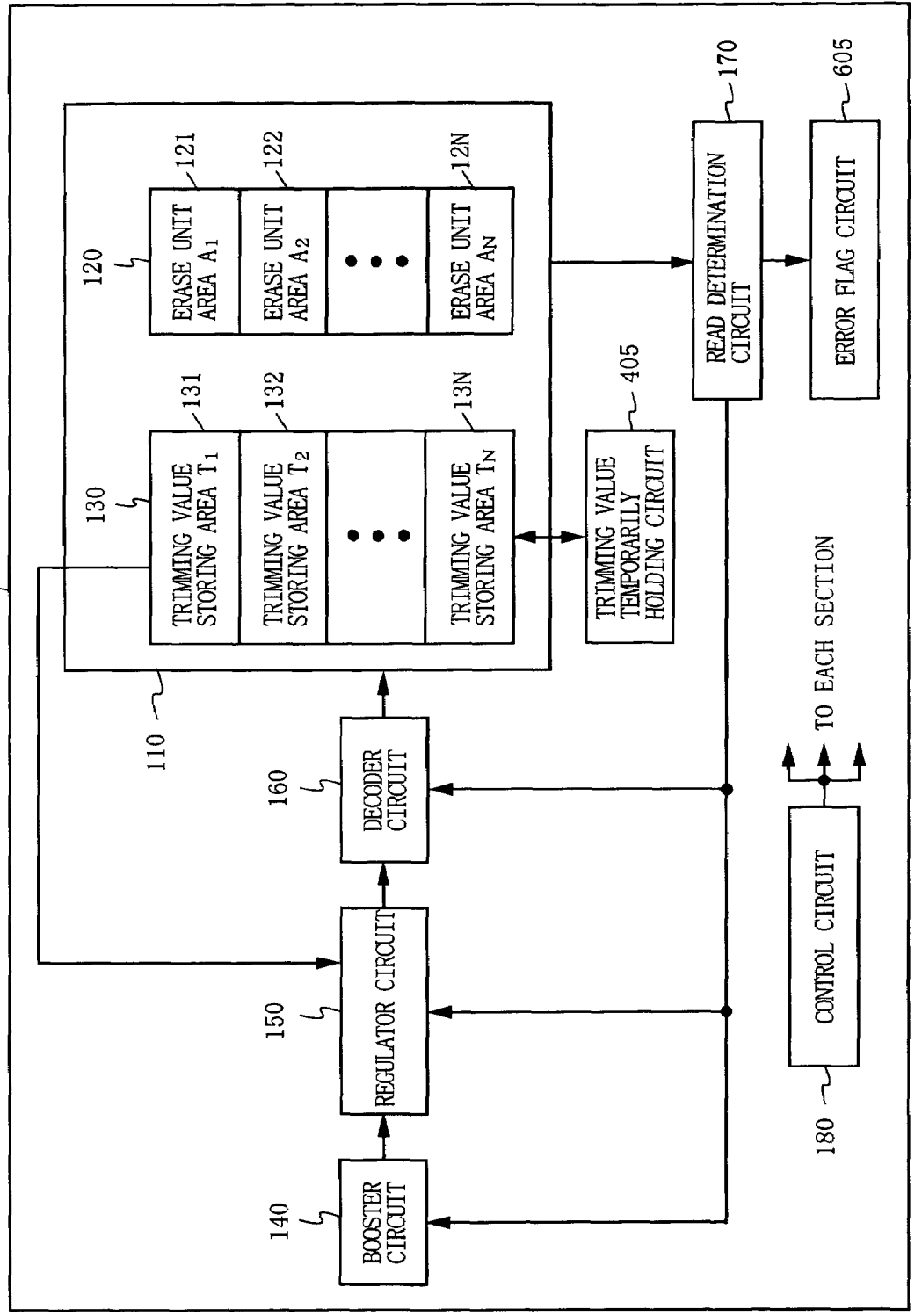
FIG. 6 is a diagram illustrating a structure of a flash EEPROM according to a fourth embodiment of the present invention.
Figure 7:
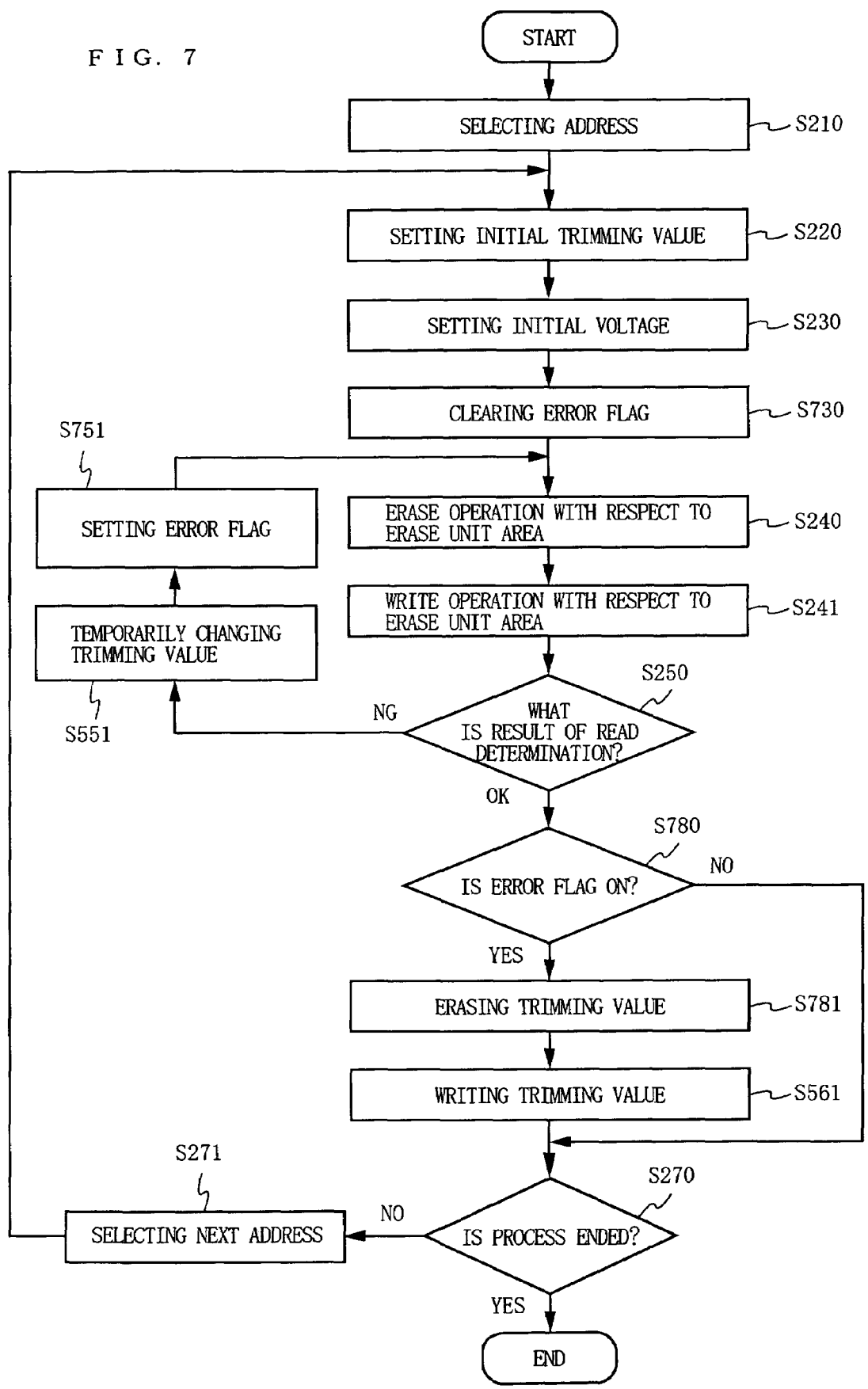
FIG. 7 is a flowchart illustrating a rewrite operation with respect to the flash EEPROM of the fourth embodiment of the present invention.

FIG. 6 is a diagram illustrating a structure of a flash EEPROM according to a fourth embodiment of the present invention. The flash EEPROM 600 of FIG. 6 is obtained by adding an error flag circuit 605 to the flash EEPROM 400 of the third embodiment. FIG. 7 is a flowchart illustrating a rewrite operation in the flash EEPROM 600 of the fourth embodiment. This flowchart is obtained by adding steps S730, S751, and S780 and replacing step S560 with step S781 in the flowchart of FIG. 5.

The flash EEPROM of the fourth embodiment is different from the flash EEPROM of the third embodiment in the following. The flash EEPROM 600 of the fourth embodiment comprises the error flag circuit 605 in addition to the components of the flash EEPROM 400 of the third embodiment. The error flag circuit 605 is a volatile memory section which stores an error flag, and is composed of, for example, a CMOS circuit or the like.

As illustrated in FIG. 7, the flash EEPROM 600 clears the error flag stored in the error flag circuit 605 before performing an erase operation and a write operation with respect to an erase unit area (step S730), and when it is determined as a result of read determination that an abnormality occurs (NG in step S250), changes the temporary trimming value (step S551) and sets the error flag into the error flag circuit 605 (step S751).

When it is determined as a result of read determination that an abnormality does not occur (OK in step S250), the control of the write operation goes to step S780. When the error flag is set in the error flag circuit 605 (YES in step S780), the flash EEPROM 600 erases a trimming value corresponding to an erase unit area 120 selected in step S210 or the like (step S781), and writes a new trimming value corresponding to the erase unit area (step S561). The details of steps S781 and S561 are the same as those of steps S260 and S261 of the flowchart of FIG. 2.

As described above, the flash EEPROM of the fourth embodiment holds a result of read determination in an error flag circuit, and updates a trimming value only when an abnormality is stored in the error flag circuit. Therefore, when it is determined as a result of read determination that an abnormality does not occur, the flash EEPROM does not update a trimming value. Therefore, according to the flash EEPROM of the fourth embodiment, it is possible to further reduce a rewrite time when a trimming value is not updated, in addition to the effect of the flash EEPROM of the third embodiment.

Fifth Embodiment

Figure 8:
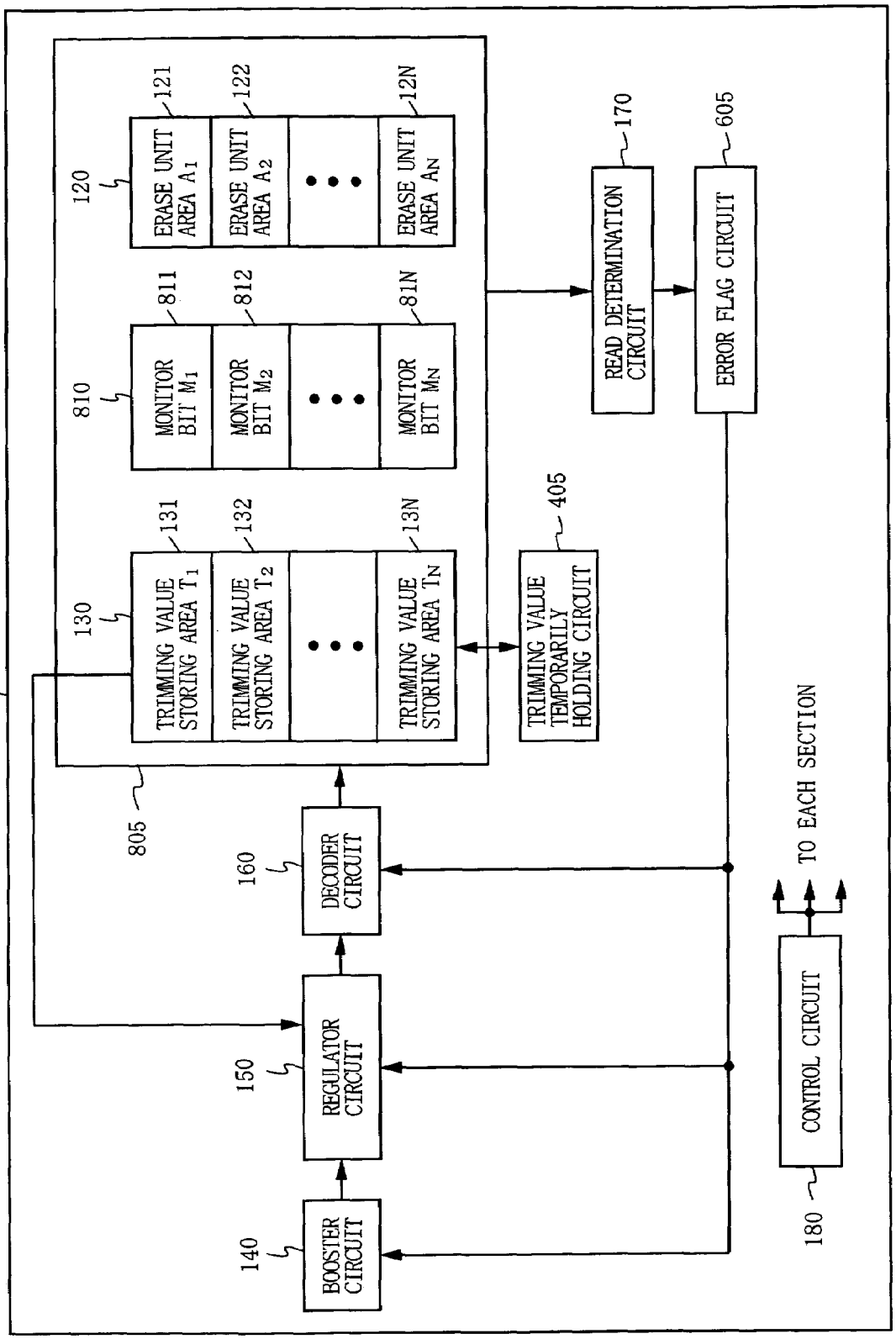
FIG. 8 is a diagram illustrating a structure of a flash EEPROM according to a fifth embodiment of the present invention.
Figure 9:
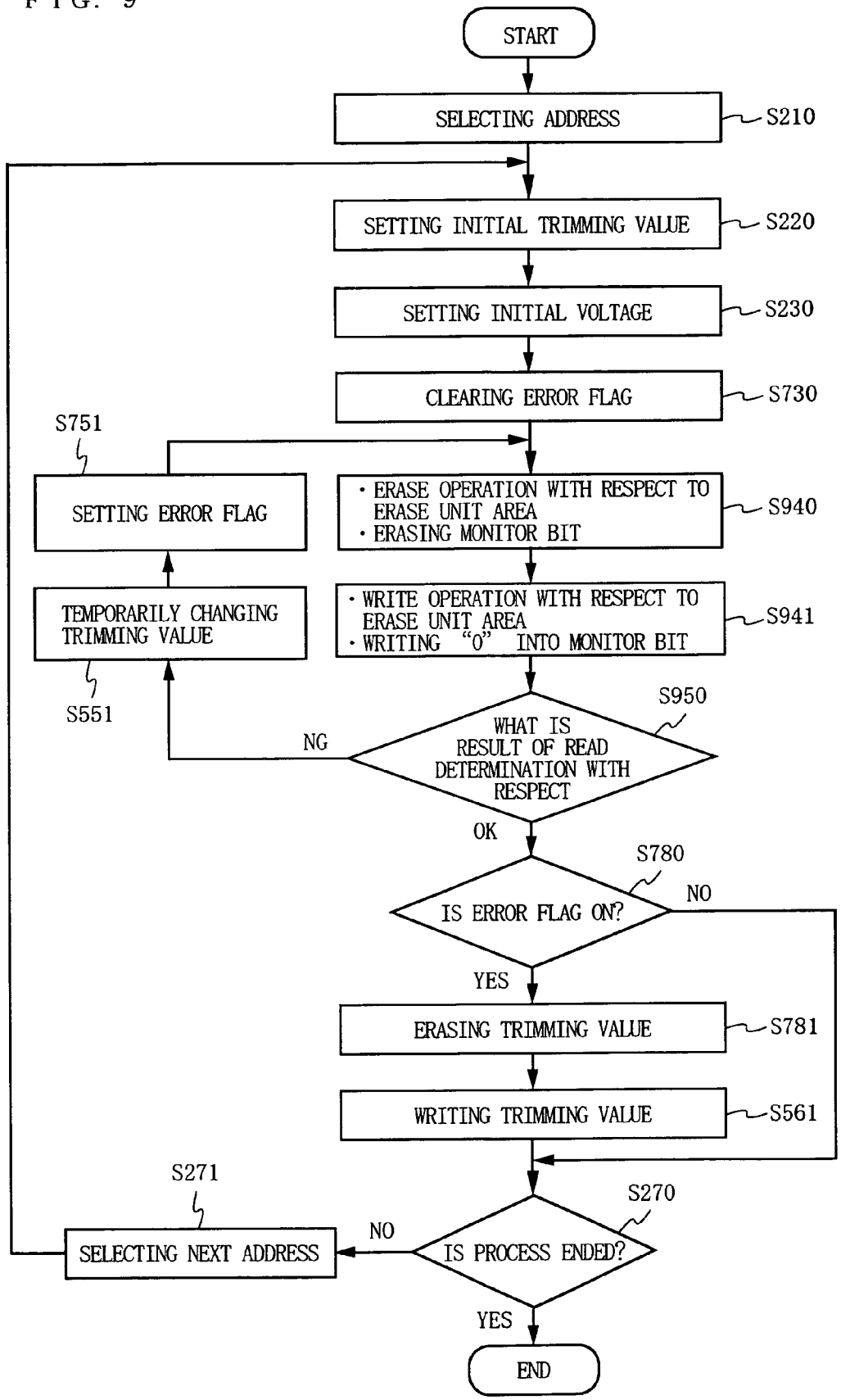
FIG. 9 is a flowchart illustrating a rewrite operation with respect to the flash EEPROM of the fifth embodiment of the present invention.

FIG. 8 is a diagram illustrating a structure of a flash EEPROM according to a fifth embodiment of the present invention. The flash EEPROM 800 of FIG. 8 is obtained by replacing the memory cell array 110 with a memory cell array 805 in the flash EEPROM 600 of the fourth embodiment. The memory cell array 805 is obtained by adding N monitor bits 811 to 81N to the memory cell array 110. FIG. 9 is a flowchart illustrating a rewrite operation of the flash EEPROM of the fifth embodiment. This flowchart is obtained by replacing steps S240, S241, and S250 with steps S940, S941, and S950 in the flowchart of FIG. 7.

The flash EEPROM of the fifth embodiment is different from the flash EEPROM of the fourth embodiment in the following. The flash EEPROM 800 of the fifth embodiment comprises the N monitor bits 811 to 81N, which constitute a non-volatile memory section, in addition to the components of the flash EEPROM of the fourth embodiment. The monitor bits 811 to 81N are provided in the memory cell array 805, corresponding to the erase unit areas 121 to 12N, respectively. The monitor bits 811 to 81N are each composed of a memory cell transistor of the same type as that of the memory cell transistor included in the erase unit area 120.

As illustrated in FIG. 9, when performing an erase operation with respect to the erase unit area 120 selected in step S210 or the like, the flash EEPROM 800 also performs an erase operation with respect to the corresponding monitor bit 810 (step S940). When performing a write operation with respect to the erase unit area 120 selected in step S210 or the like, the flash EEPROM 800 invariably writes "0" to the corresponding monitor bit 810 (step S941). When performing read determination, the flash EEPROM 800 uses the monitor bit 810 (step S950).

Figure 10A:
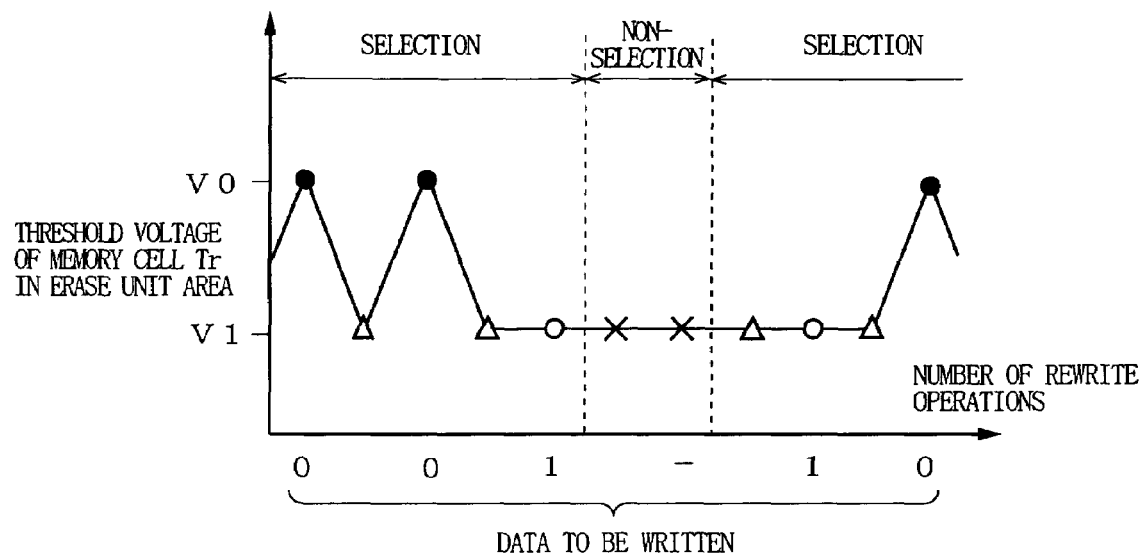
FIGS. 10A and 10B are diagrams for explaining a method of using a monitor bit in the flash EEPROM of the fifth embodiment of the present invention.
Figure 10B:
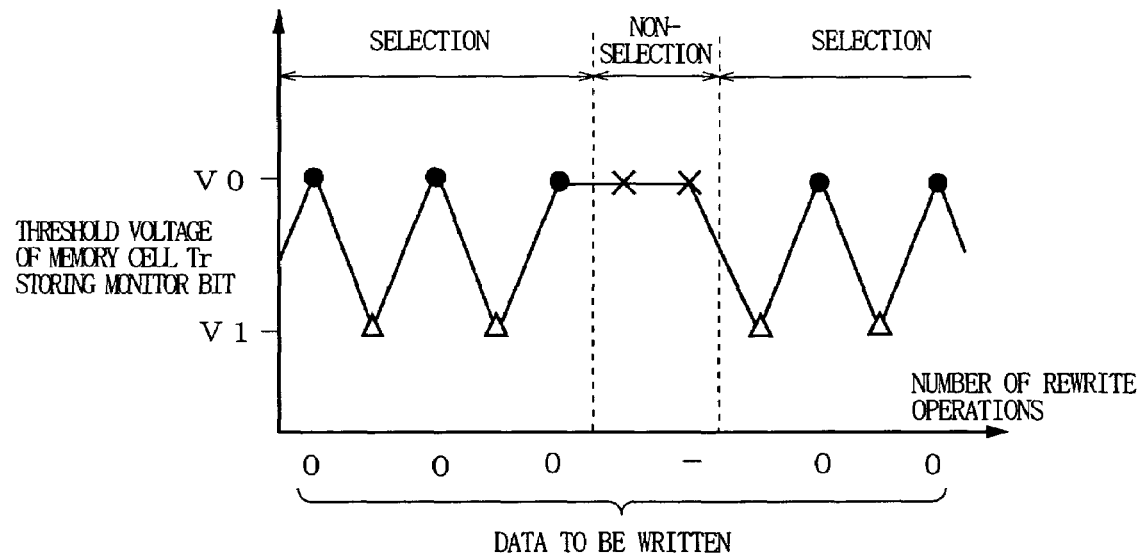

A method of using the monitor bit 810 of the flash EEPROM 800 will be described with reference to FIGS. 10A and 10B. FIG. 10A illustrates a relationship between the number of rewrite operations and the threshold voltage of a certain memory cell transistor included in the erase unit area 120 (hereinafter referred to as an "erase unit area A"), in the flash EEPROM 800. FIG. 10B illustrates a relationship between the number of rewrite operations and the threshold voltage of a memory cell transistor storing a monitor bit 810 corresponding to the erase unit area A (hereinafter referred to as a "monitor bit M"), in the flash EEPROM 800. In FIGS. 10A and 10B, open triangles indicate erase operations with respect to the erase unit area A or the monitor bit M (erase operations using data "1"), closed circles indicate writing data "0" to the erase unit area A or the monitor bit M, open circles indicate writing data "1" to the erase unit area A, and crosses indicate that the erase unit area A is not selected.

As illustrated in FIG. 10A, when the erase unit area A is selected, an erase operation and a write operation (writing data "0" or "1") are performed with respect to the erase unit area A. At the same time, an erase operation and a write operation (writing data "0") are performed with respect to the monitor bit M, as illustrated in FIG. 10B. When the erase unit area A is not selected, no steps are performed with respect to the erase unit area A and the monitor bit M.

Memory cell transistors included in the flash EEPROM 800 are degraded with an increase in the number of times of writing data "0". Therefore, when a rewrite operation is repeatedly performed with respect to the flash EEPROM 800, the characteristics of a memory cell transistor storing the monitor bit 810 are degraded earlier (or with the same speed) than those of all memory cell transistors included in the erase unit area 120. Therefore, when read determination is performed using the monitor bit 810, an abnormality is detected earlier than or at the same time as when read determination is performed using the erase unit area 120.

As described above, the flash EEPROM of the fifth embodiment has, for each erase unit area, a monitor bit whose characteristics are degraded earlier than those of an erase unit area and performs read determination using the monitor bit. Therefore, the flash EEPROM detects an abnormality earlier than when read determination is performed with respect to an erase unit area, so that a post-regulation erase/write voltage is regulated to a high level at an earlier stage. Therefore, according to the flash EEPROM of the fifth embodiment, it is possible to more reliably perform a rewrite operation with respect to a memory cell transistor.

Sixth Embodiment

Figure 11:
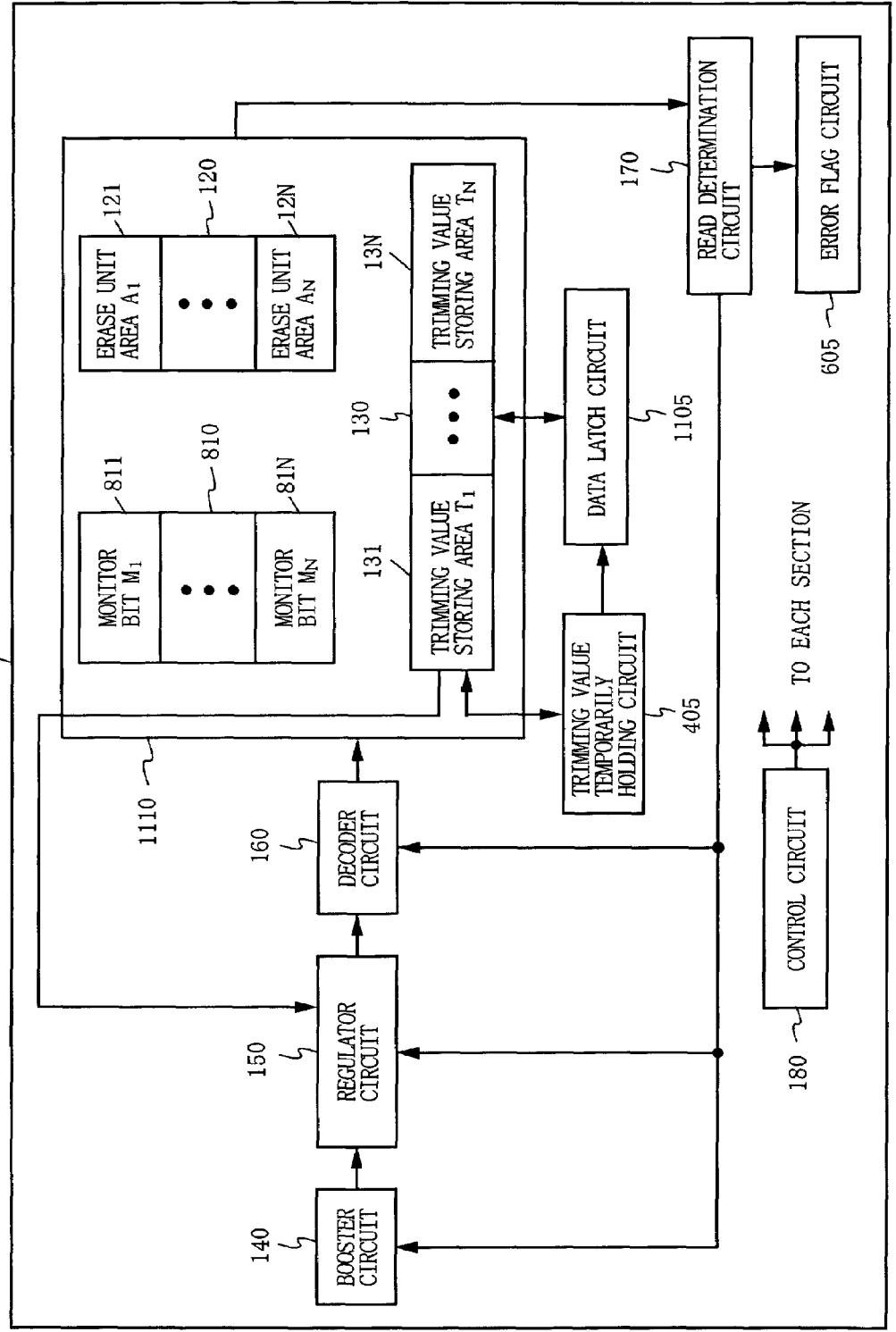
FIG. 11 is a diagram illustrating a structure of a flash EEPROM according to a sixth embodiment of the present invention.
Figure 12:
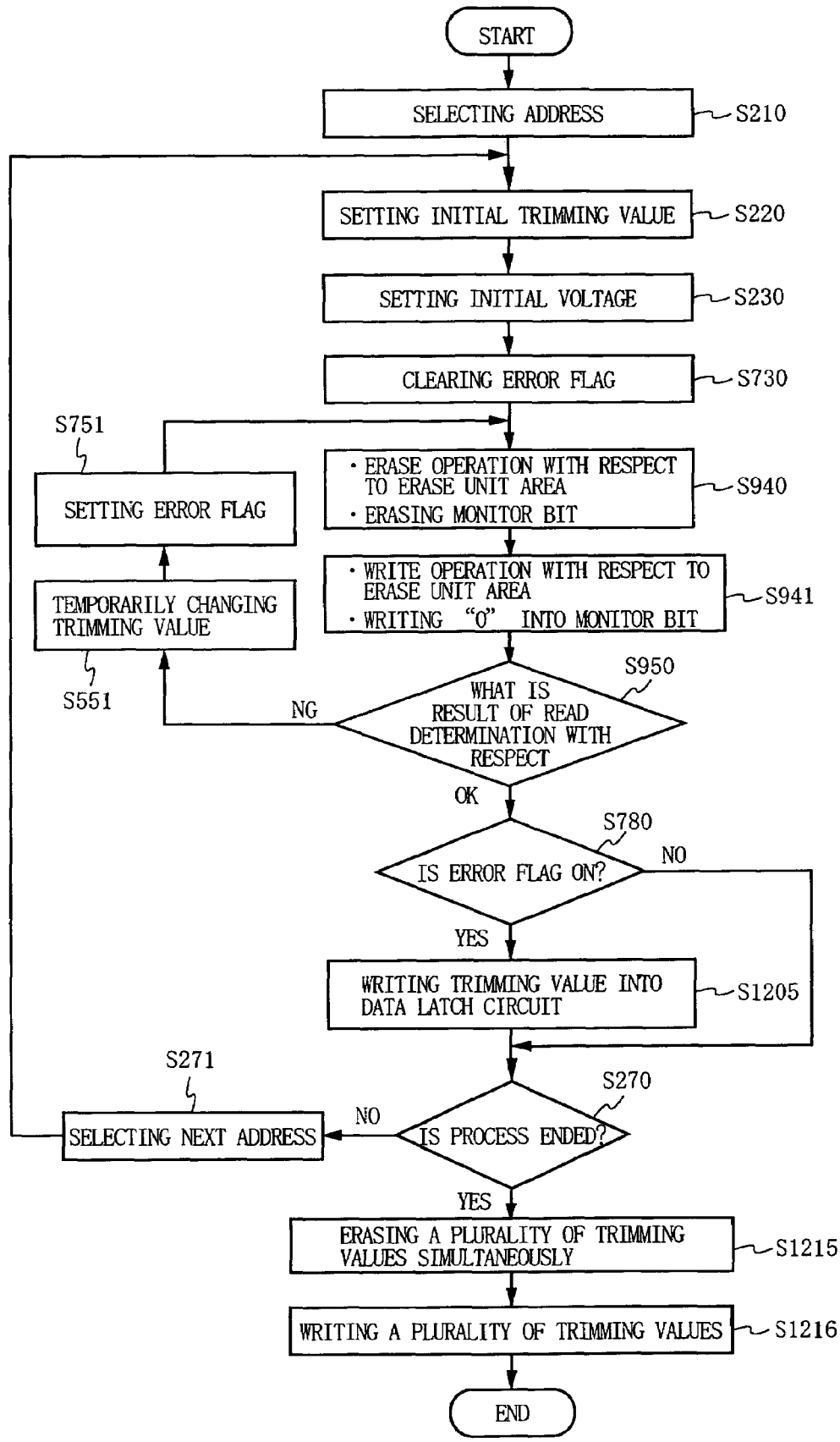
FIG. 12 is a flowchart illustrating a rewrite operation with respect to the flash EEPROM of the sixth embodiment of the present invention.

FIG. 11 is a diagram illustrating a structure of a flash EEPROM according to a sixth embodiment of the present invention. The flash EEPROM 1100 of FIG. 11 is obtained by replacing the memory cell array 805 with a memory cell array 1110 in the flash EEPROM 800 of the fifth embodiment and adding a data latch circuit 1105 thereto. As does the memory cell array 805, the memory cell array 1110 includes N erase unit areas 121 to 12N, N trimming value storing areas 131 to 13N, and N monitor bits 811 to 81N. Note that, in the memory cell array 1110, the N trimming value storing areas 131 to 13N can be simultaneously selected and erased. FIG. 12 is a flowchart illustrating a rewrite operation in the flash EEPROM 1100 of the sixth embodiment. This flowchart is obtained by replacing step S781 and S561 with step S1205 in the flowchart of FIG. 9 and adding step S1215 and S1216 thereto.

The flash EEPROM of the sixth embodiment is different from the flash EEPROM of the fifth embodiment in the following. The flash EEPROM 1100 of the sixth embodiment comprises the data latch circuit 1105 in addition to the components of the flash EEPROM 800 of the fifth embodiment. The data latch circuit 1105 is a volatile memory section made of, for example, a CMOS circuit or the like. The data latch circuit 1105 temporarily stores N trimming values to be set into the trimming value storing areas 131 to 13N.

As illustrated in FIG. 12, when an error flag is stored in the error flag circuit 605 at the time of completing an erase operation and a write operation with respect to a certain erase unit area 120 (YES in step S780), the flash EEPROM 1100 writes a temporary trimming value stored in the trimming value temporarily holding circuit 405 into the data latch circuit 1105 (step S1205). Thus, the flash EEPROM 1100 does not update a trimming value stored in trimming value storing area 130 at the time of completing a rewrite operation with respect to one erase unit area 120. Therefore, in the data latch circuit 1105, the trimming values $T_1$ to $T_N$ corresponding to the erase unit areas 121 to 12N are successively set.

As described above, the trimming value storing areas 131 to 13N included in the flash EEPROM 1100 can be simultaneously selected and erased. The flash EEPROM 1100 simultaneously erases the N trimming values $T_1$ to $T_N$ stored in the trimming value storing areas 131 to 13N before a write operation is ended for all of the erase unit areas 121 to 12N (step S1215), and writes the N trimming values stored in the data latch circuit 1105 into the trimming value storing areas 131 to 13N (step S1216).

More specifically, in step S1215, a post-regulation erase voltage is simultaneously applied to the trimming value storing areas 131 to 13N. Thereby, the N trimming values stored in the trimming value storing areas 131 to 13N are simultaneously erased. In step S1216, while applying the post-regulation write voltage to the trimming value storing areas 131 to 13N, a memory cell transistor(s) corresponding to a bit of "0" in the trimming value stored in the data latch circuit 1105 is successively selected from the memory cell transistors included in each trimming value storing area. Thereby, the N trimming values stored in the trimming value storing areas 131 to 13N are updated to the values stored in the data latch circuit 1105.

Note that, in order to correctly perform a write operation in accordance with the flowchart of FIG. 12, for example, when an initial trimming value is set in step S220, the flash EEPROM 1100 writes the set trimming value into the data latch circuit 1105.

As described above, when ending a write operation with respect to a certain erase unit area, the flash EEPROM of the sixth embodiment holds a trimming value used in the write operation in a data latch circuit, and updates a trimming value corresponding to each erase unit area to the trimming value held in the data latch circuit before ending a write operation for all erase unit areas. Thereby, it is possible to reduce the number of write operations with respect to a trimming value storing area, thereby further reducing a time required to update a trimming value, and to suppress a degradation in a memory cell transistor included in a trimming value storing area, thereby improving the number of rewrite operations.

Seventh Embodiment

Figure 13:
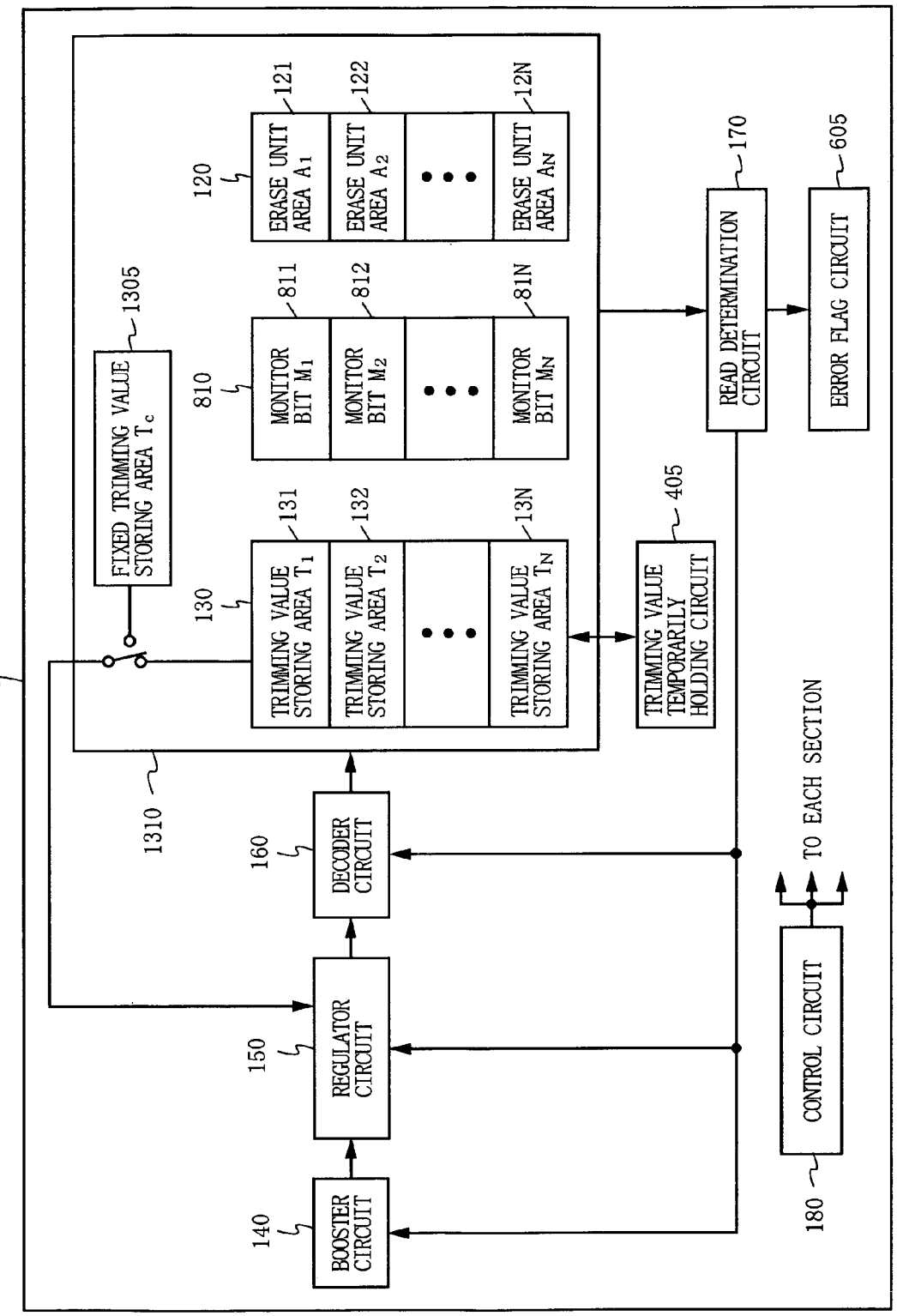
FIG. 13 is a diagram illustrating a structure of a flash EEPROM according to a seventh embodiment of the present invention.

FIG. 13 is a diagram illustrating a structure of a flash EEPROM according to a seventh embodiment of the present invention. The flash EEPROM 1300 of FIG. 13 is obtained by replacing the memory cell array 805 with a memory cell array 1310 in the flash EEPROM 800 of the fifth embodiment. The memory cell array 1310 is obtained by adding a fixed trimming value storing area 1305 to the memory cell array 805.

The flash EEPROM of the seventh embodiment is different from the flash EEPROM of the fifth embodiment in the following. The flash EEPROM 1300 of the seventh embodiment comprises the fixed trimming value storing area 1305 in addition to the components of the flash EEPROM 800 of the fifth embodiment. The fixed trimming value storing area 1305 is a non-volatile memory section provided in the memory cell array 1310. The fixed trimming value storing area 1305 fixedly stores a trimming value which is not affected by the number of rewrite operations of the erase unit area 120 or the monitor bit 810. Hereinafter, a trimming value stored in the fixed trimming value storing area 1305 is referred to as a "fixed trimming value".

As does the flash EEPROM 800, the flash EEPROM 1300 performs a rewrite operation in accordance with the flowchart of FIG. 9. Note that the flash EEPROM 1300 uses a fixed trimming value when a write operation is performed with respect to the erase unit area 120 and the monitor bit 810 in step S941. Therefore, when a write operation is performed, a fixed write voltage whose level is regulated using the fixed trimming value is supplied to a selected the erase unit area 120.

Figure 14:
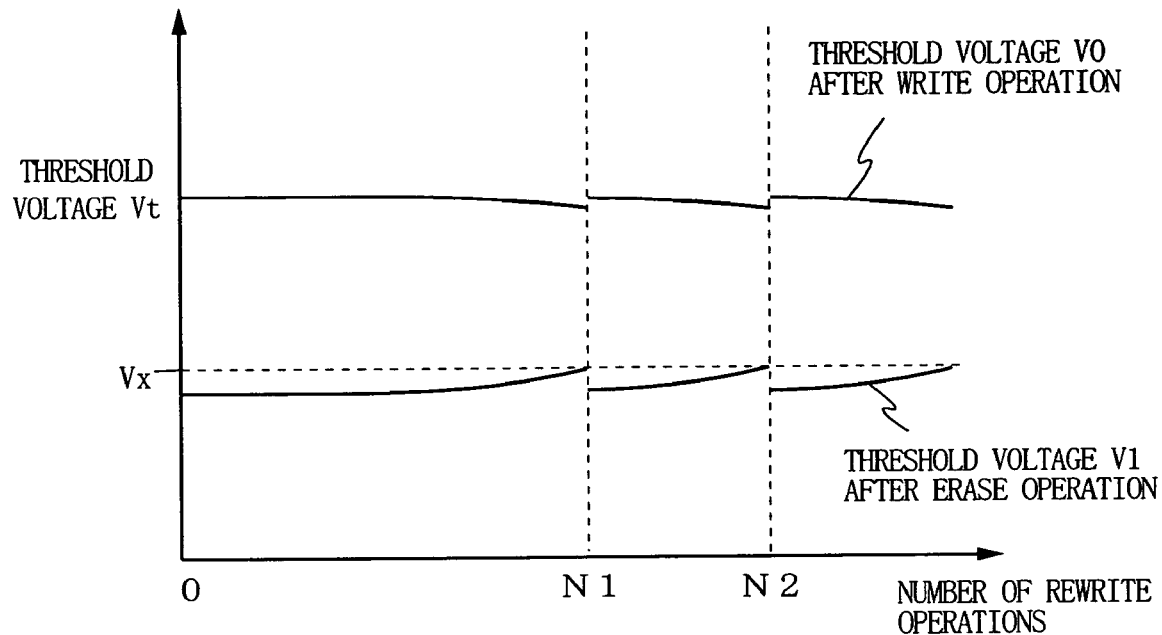
FIG. 14 is a diagram illustrating a relationship (first example) between the number of rewrite operations and a threshold voltage in a flash EEPROM.
Figure 15:
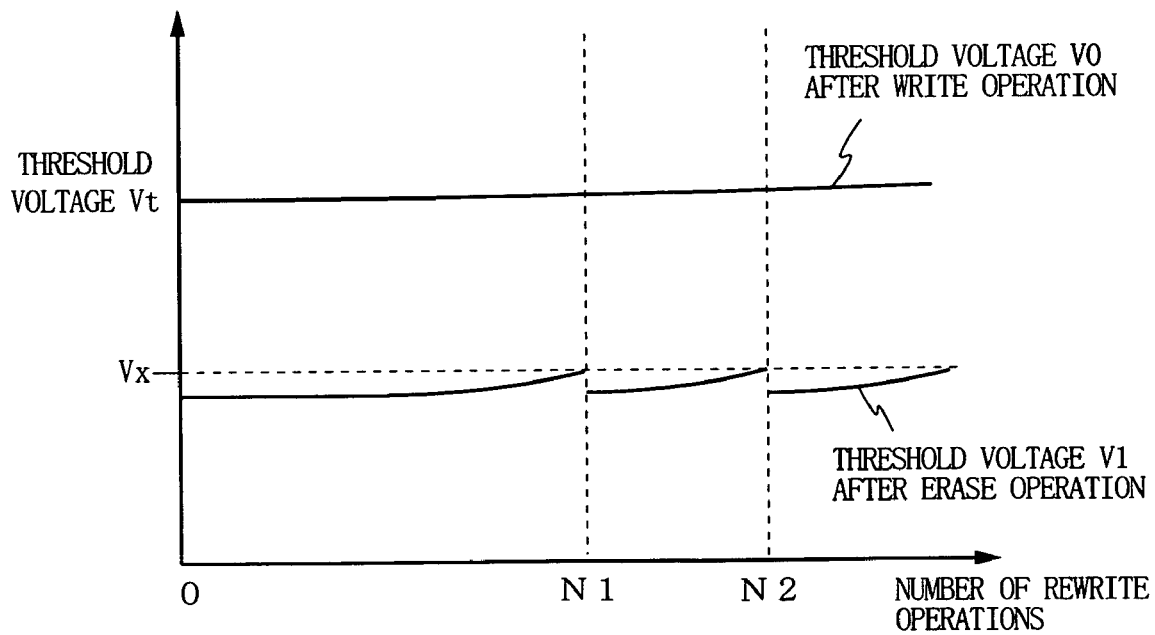
FIG. 15 is a diagram illustrating a relationship (second example) between the number of rewrite operations and a threshold voltage in a flash EEPROM.

Hereinafter, an effect of supplying a fixed post-regulation write voltage will be described with reference to FIGS. 14 and 15. FIGS. 14 and 15 are diagrams illustrating a relationship between the number of rewrite operations and a threshold voltage in a flash EEPROM. In FIGS. 14 and 15, the horizontal axis represents the number of rewrite operations, while the vertical axis represents the threshold voltage of a memory cell transistor. FIGS. 14 and 15 illustrate how the post-write operation threshold voltage V0 and the post-erase operation threshold voltage V1 change with an increase in the number of rewrite operations.

According to characteristics illustrated in FIG. 14, as the number of rewrite operations is increased, the post-erase operation threshold voltage V1 increases, while the post-write operation threshold voltage V0 decreases with substantially the same speed as that of the post-erase operation threshold voltage V1. Such characteristics are observed when, for example, Fowler Nordheim (FN) erase and write operations at a drain edge are performed with respect to the flash EEPROM. When FN erase and write operations at a drain edge are performed, electrons pass through a floating gate and a channel via a drain edge of a tunnel oxide film, and electrons are captured by the drain edge of the tunnel oxide film in a stochastic manner. The drain edge capturing the electrons becomes a portion of the tunnel oxide film, so that the effect of increasing an effective threshold voltage is reduced. On the other hand, the threshold voltage is increased due to a degradation in gm (mutual conductance) characteristics caused by a rewrite operation, so that an FN current during a write operation is reduced, resulting in a decrease in a threshold amplitude (a difference between the post-erase operation threshold voltage V1 and the post-write operation threshold voltage V0: also referred to as a "window width"). Therefore, the post-erase operation threshold voltage V1 increases with an increase in the number of rewrite operations, while the post-write operation threshold voltage V0 decreases with substantially the same speed as that of the post-erase operation threshold voltage V1.

When the characteristics of a memory cell transistor are degraded as described above, by increasing the post-regulation erase/write voltage with an increase in the number of rewrite operations, the number of rewrite operations can be improved, as already described in the first to sixth embodiments.

However, the characteristics of a memory cell transistor may be degraded in a manner different from those described above, as illustrated in FIG. 15. In the characteristics of FIG. 15, as the number of rewrite operations is increased, the post-erase operation threshold voltage V1 increases, and the post-write operation threshold voltage V0 also increases, but with a slower rate. Such characteristics are observed when, for example, FN erase and write operations using an entire channel are performed with respect to a flash EEPROM. When the FN erase and write operations using the entire channel are performed, electrons pass through between a floating gate and a channel via an entire surface of a tunnel oxide film, so that electrons are captured on the entire surface of the tunnel oxide film in a stochastic manner. When the threshold voltage is measured or read out, a drain current flows based on a threshold voltage which is determined, depending on a voltage applied to a gate terminal of a memory cell transistor and the amount of electric charge accumulated in a floating gate thereof. However, since electrons are captured on the entire surface of the tunnel oxide film, an effective threshold voltage increases. In addition, the threshold voltage further increases due to a degradation in gm characteristics caused by a rewrite operation. At the same time, since the FN current decreases during the rewrite operation, a threshold amplitude is narrowed. Therefore, the post-erase operation threshold voltage V1 increases with an increase in the number of rewrite operations, and the post-write operation threshold voltage V0 also increase, but with a slower rate.

Also in this case, as described in the first to sixth embodiments, by increasing both a post-regulation erase voltage and a post-regulation write voltage with an increase in the number of rewrite operations, the number of rewrite operations can also be improved. In this case, however, by fixing a write voltage while increasing an erase voltage with an increase in the number of rewrite operations, the number of rewrite operations can also be improved. By using such a fixed write voltage, the post-write operation threshold voltage V0 can be prevented from increasing to a higher level than necessary, so that effects can be obtained, such as a reduction in the amount of electric charge passing through the tunnel oxide film, a relaxation of electric field, and the like.

As described above, the flash EEPROM of the seventh embodiment comprises a fixed trimming value storing area which stores a fixed trimming value, and uses a voltage whose level is regulated using the fixed trimming value to perform a rewrite operation. Thereby, for a flash EEPROM including a memory cell transistor whose threshold voltage is not much changed even when the number of rewrite operations is increased, the number of rewrite operations can be increased for all erase unit areas. Note that, for a flash EEPROM in which a post-erase operation threshold voltage changes more slowly than a post-write operation threshold voltage does with an increase in the number of rewrite operations, a voltage whose level is regulated using the fixed trimming value may be used to perform an erase operation.

Eighth Embodiment

Figure 16:
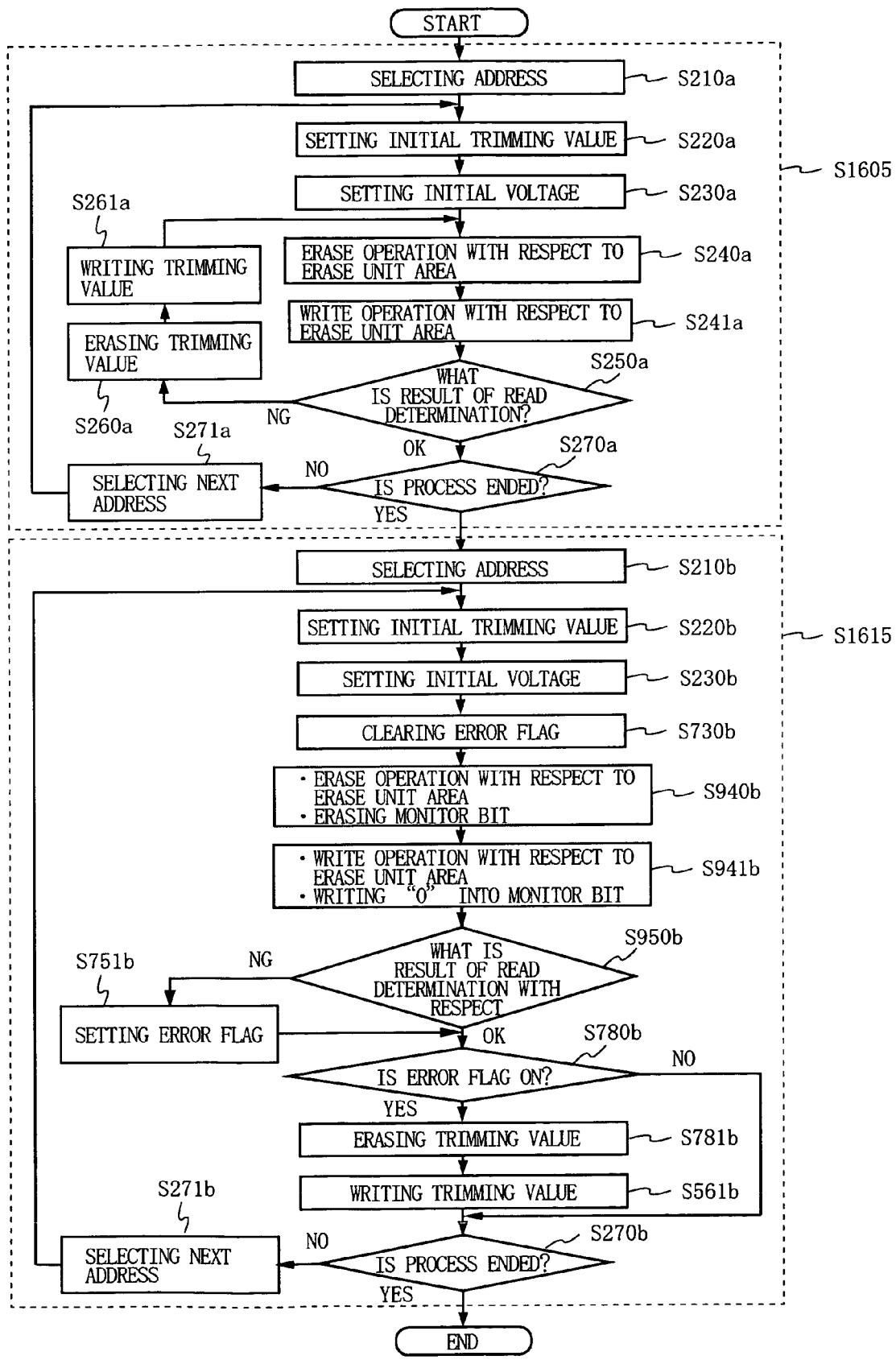
FIG. 16 is a flowchart illustrating a rewrite operation with respect to a flash EEPROM of an eighth embodiment of the present invention.

A flash EEPROM according to an eighth embodiment of the present invention has a structure as that of the fifth embodiment (see FIG. 8). FIG. 16 is a flowchart illustrating a rewrite operation performed in the flash EEPROM of the eighth embodiment. As illustrated in FIG. 16, the flash EEPROM of the eighth embodiment performs step S1605 when performing a rewrite operation with respect to each erase unit area 120 for the first time, and performs step S1615 when performing a rewrite operation with respect to each erase unit area 120 for the second time and thereafter. Typically, step S1605 is performed in a shipment testing step before shipping a flash EEPROM, and step S1615 is repeatedly performed in an actual use environment after shipment of the flash EEPROM. Hereinafter, the operation in step S1605 is referred to as a "pre-shipment rewrite operation", and the operation in step S1615 is referred to as a "post-shipment rewrite operation".

The pre-shipment rewrite operation is the same as the rewrite operation of FIG. 2. Note that, in step S250*a*, read determination is performed for all memory cell transistors included in an erase unit area selected in step S210*a* or the like. Thereby, at the time when the pre-shipment rewrite operation is completed, trimming values which are guaranteed to correctly rewrite the erase unit areas 121 to 12N (i.e., trimming values which can be used to correctly rewrite memory cell transistors which are included in the erase unit areas 121 to 12N and have worst characteristics) are set in the respective trimming value storing areas 131 to 13N. As described above, the flash EEPROM of the eighth embodiment can be shipped in a state which guarantees a correct rewrite operation if a trimming value given as an initial value is used.

The post-shipment rewrite operation is obtained by deleting step S551 in the flowchart of FIG. 9 and providing step S780*b* following step S751*b*. In the post-shipment rewrite operation, when it is determined as a result of read determination using a monitor bit that an abnormality occurs (YES in step S950*b*), an error flag is set in the error flag circuit 605 (step S751*b*). When the error flag is set (YES in step S780*b*), the step of erasing a trimming value (step S781*b*) and the step of writing a trimming value (step S561*b*) are performed. Thus, in the post-shipment rewrite operation, read determination is performed using a monitor bit, and when it is determined that an abnormality occurs in a monitor bit corresponding to a certain erase unit area, a trimming value corresponding to the erase unit area is updated.

Therefore, in the post-shipment rewrite operation, an abnormality is detected earlier than when read determination is performed using an erase unit area, so that a post-regulation erase/write voltage is regulated to a high level at an earlier stage. Thereby, it is possible to reliably perform a rewrite operation with respect to a memory cell transistor.

As described above, the flash EEPROM of the eighth embodiment is brought into a state which guarantees a rewrite operation after a pre-shipment rewrite operation is performed, and even after a subsequent post-shipment rewrite operation is performed, a rewrite operation can be continuously performed reliably and correctly. Therefore, even when the characteristics of a memory cell transistor vary in units of a bit, the number of rewrite operations can be improved for all erase unit areas without being affected by such a variation.

Ninth Embodiment

Figure 17:
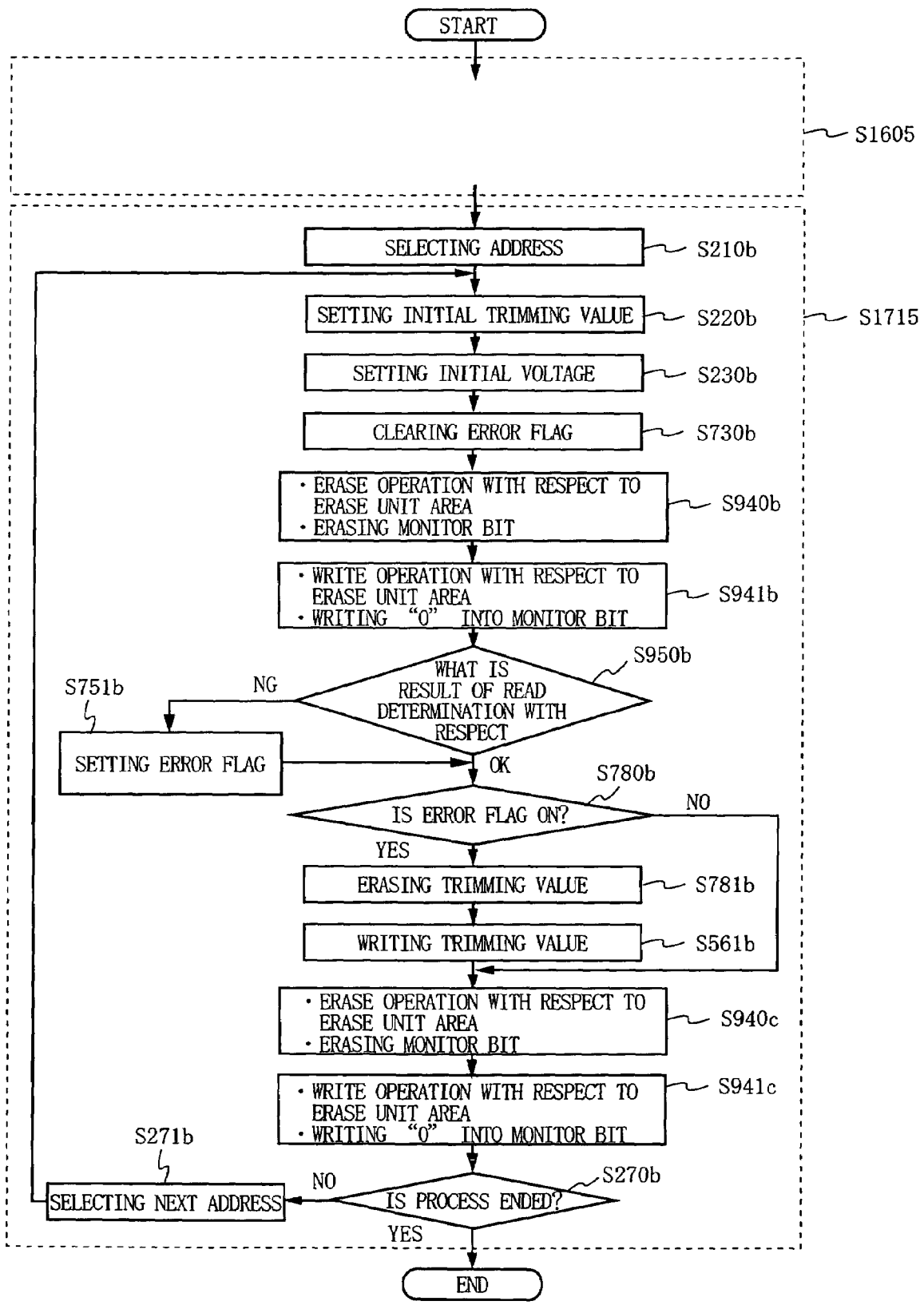
FIG. 17 is a flowchart illustrating a rewrite operation with respect to a flash EEPROM of a ninth embodiment of the present invention.

A flash EEPROM according to a ninth embodiment of the present invention has the same structure as that of the fifth embodiment (see FIG. 8). FIG. 17 is a flowchart illustrating a rewrite operation in the flash EEPROM of the ninth embodiment. The flowchart of FIG. 17 is obtained by replacing step S1615 with step S1715 in the flowchart of FIG. 16. Step S1715 is obtained by adding steps S940*c* and S941*c* to step S1615. In the ninth embodiment, an operation in step S1715 is referred to as a post-shipment rewrite operation.

In the post-shipment rewrite operation, the flash EEPROM of the ninth embodiment performs steps S940*c* and S941*c* before completing the process for one erase unit area 120. More specifically, after a trimming value which guarantees a rewrite operation is established, the flash EEPROM uses the trimming value again to perform an erase operation with respect to the erase unit area 120 and the monitor bit 810 (step S940*c*) and a write operation with respect to the erase unit area 120 and the monitor bit 810 (step S941*c*). Note that, in step S941*c*, data "0" is invariably written into the monitor bit 810. Thus, by performing a rewrite operation again after a trimming value which guarantees the rewrite operation is established, the rewrite operation can be more reliably performed with respect to a memory cell transistor.

Tenth Embodiment

Figure 18:
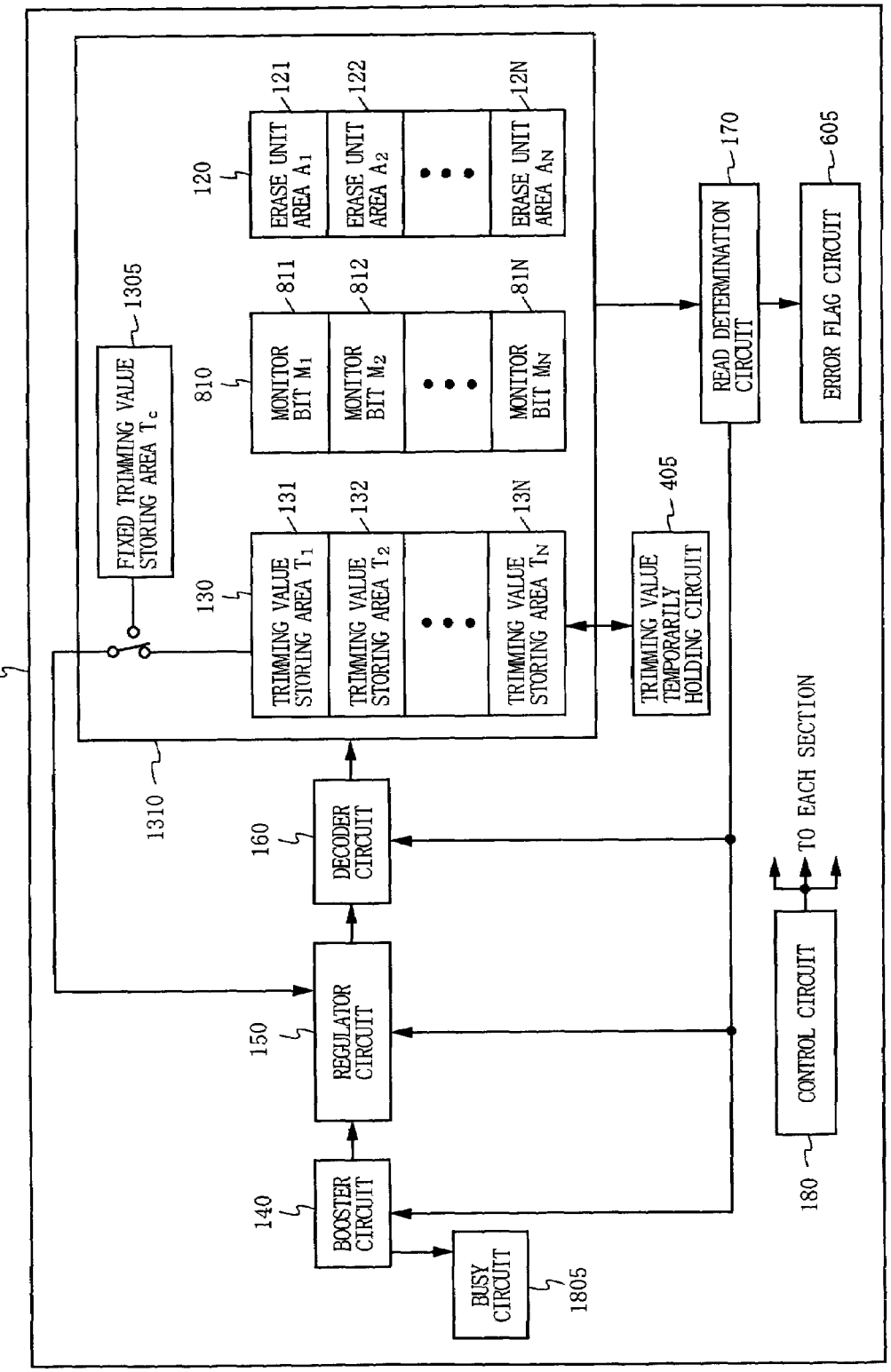
FIG. 18 is a diagram illustrating a structure of a flash EEPROM according to a tenth embodiment of the present invention.
Figure 19:
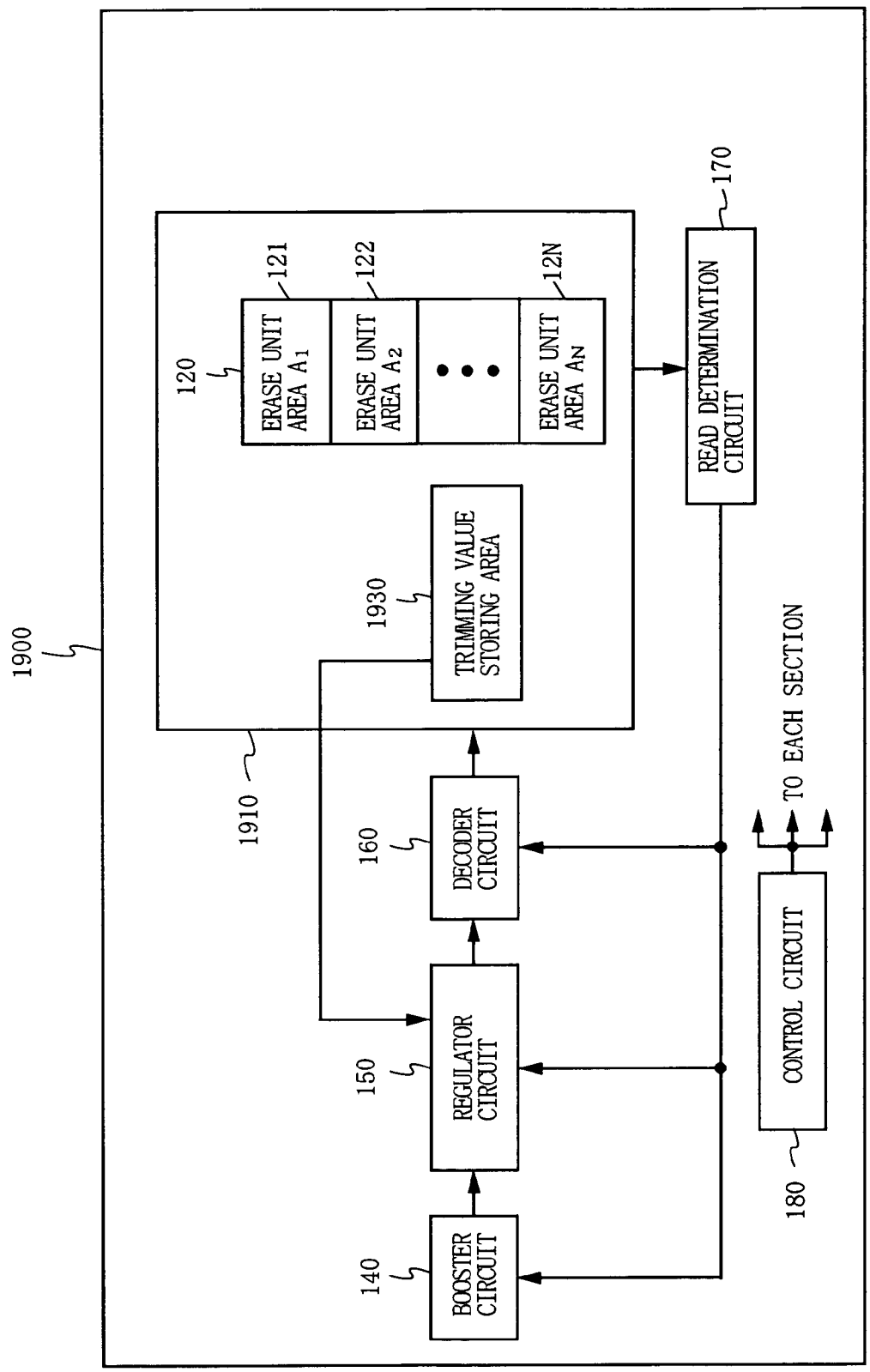
FIG. 19 is a diagram illustrating a structure of a conventional flash EEPROM.
Figure 20:
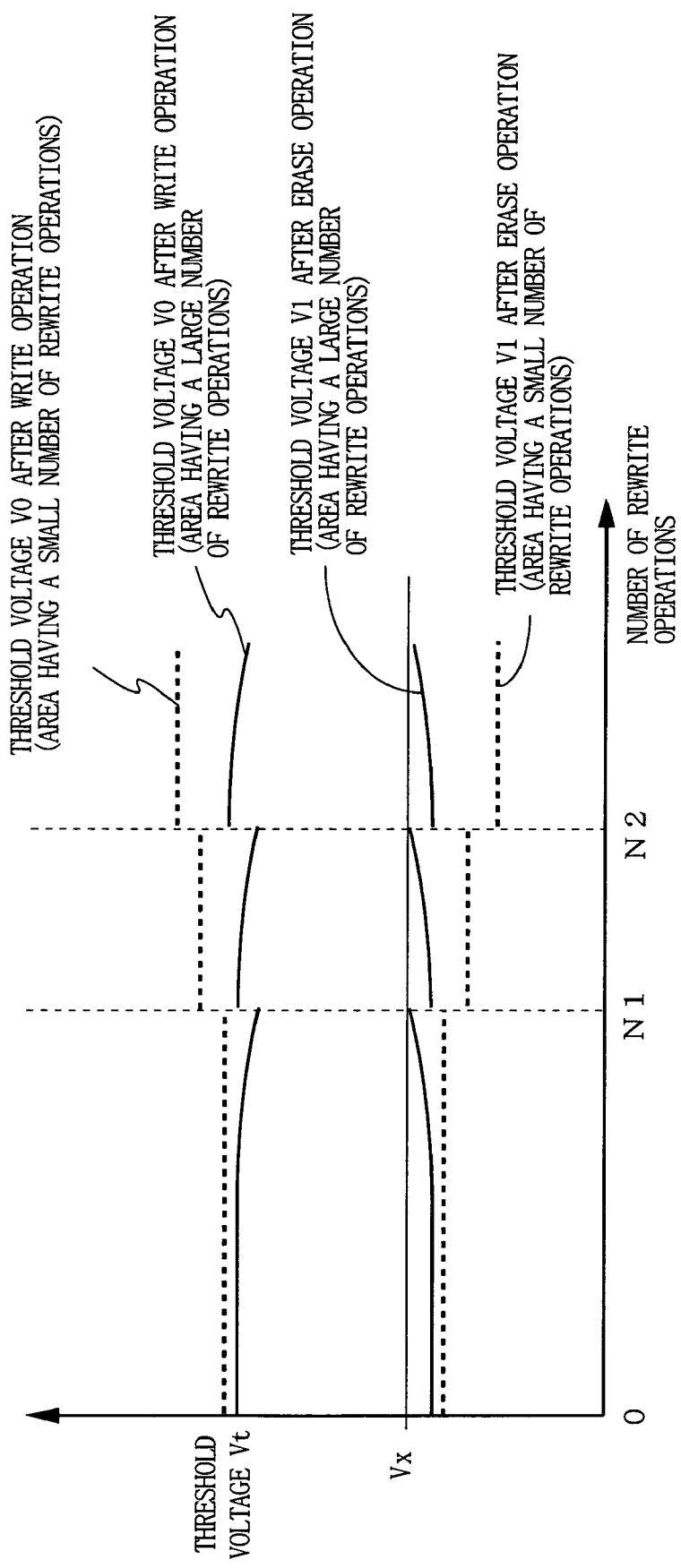
FIG. 20 is a diagram illustrating a relationship between the number of rewrite operations and a threshold voltage in a conventional flash EEPROM.

FIG. 18 is a diagram illustrating a structure of a flash EEPROM according to a tenth embodiment of the present invention. The flash EEPROM 1800 of FIG. 18 is obtained by adding a busy circuit 1805 to the flash EEPROM 1300 of the seventh embodiment. As does the flash EEPROM 1300, the flash EEPROM 1800 performs a rewrite operation in accordance with the flowchart of FIG. 9.

The flash EEPROM of the tenth embodiment is different from the flash EEPROM of the seventh embodiment in the following. The flash EEPROM 1800 of the tenth embodiment comprises the busy circuit 1805 in addition to the components of the flash EEPROM of the seventh embodiment. The busy circuit 1805 outputs a busy signal which indicates that the flash EEPROM 1800 is under operation. For example, when it is determined as a result of read determination in step S950 that an abnormality occurs, the busy circuit 1805 may output a busy signal during an erase or write operation with respect to the erase unit area 120. Alternatively, when it is determined as a result of read determination in step S950 that an abnormality occurs, the busy circuit 1805 may output a busy signal during an erase or write operation with respect to the trimming value storing area 130. Alternatively, when it is determined as a result of read determination in step S950 that an abnormality occurs, the busy circuit 1805 may output a busy signal during an erase or write operation with respect to any one of the erase unit area 120 and the trimming value storing area 130.

As described above, the flash EEPROM of the tenth embodiment comprises a busy circuit which outputs a busy signal. Therefore, the external controllability of the flash EEPROM can be enhanced in addition to the effect of improving the number of rewrite operations for all erase unit areas.

The flash EEPROMs of the first to tenth embodiments have been heretofore described. The features of the flash EEPROMs of these embodiments can be arbitrarily combined to construct other flash EEPROMs as long as the features do not cancel each other.

In the above-described embodiments, flash EEPROMs have been illustrated as non-volatile memory devices. Further, the present invention can be applied to EEPROM, FeRAM (ferroelectric memory), MRAM (magnetic non-volatile memory), and the like.

While the invention has been described in detail, the foregoing description is in all aspects illustrative and not restrictive. It is understood that numerous other modifications and variations can be devised without departing from the scope of the invention.

What is claimed is:

1. An electrically erasable and programmable non-volatile memory device comprising:
    a plurality of erase unit areas each including a plurality of non-volatile memory cell transistors which are simultaneously selected in an erase operation;
    a plurality of output regulating value storing sections provided corresponding to the respective erase unit areas, of storing output regulating values of the respective erase unit areas in a non-volatile manner;
    a voltage generating circuit of generating a voltage having a level required in an erase operation and a write operation with respect to each of the erase unit areas;
    a voltage regulating circuit of regulating the level of the voltage generated in the voltage generating circuit based on a corresponding one of the output regulating values provided thereto;
    a read determination circuit of performing determination with respect to data after an erase operation and a write operation with respect to each of the erase unit areas; and
    a control circuit of operating in an erase operation and a write operation with respect to each of the erase unit areas.

2. The non-volatile memory device according to claim 1, wherein the read determination circuit performs the determination step in accordance with a criterion stricter than when a read operation is performed.

3. The non-volatile memory device according to claim 2, wherein, when performing the determination step, the read determination circuit applies to a current detection type sense amplifier circuit a reference current which provides a criterion stricter than when a read operation is performed.

4. The non-volatile memory device according to claim 2, wherein when performing the determination step, the read determination circuit applies to the memory cell transistor a gate voltage which provides a criterion stricter than when a read operation is performed.

5. The non-volatile memory device according to claim 1, wherein the voltage regulating circuit includes a limiter circuit of limiting an output voltage within a breakdown-voltage specification of the memory cell transistor.

6. The non-volatile memory device according to claim 1, wherein the control circuit performs the steps of:
    selecting one of the erase unit areas;
    providing to the voltage regulating circuit the output regulating value stored in the output regulating value storing section corresponding to the selected erase unit area; and
    performing a control so that, when the read determination circuit detects an abnormality as a result of the determination step after an erase operation and a write operation are performed with respect to the selected erase unit area, the output regulating value stored in the output regulating value storing section corresponding to the selected erase unit area is updated to a value which causes an output voltage to be higher than before, and thereafter, an erase operation and a write operation are performed again with respect to the selected erase unit area.

7. The non-volatile memory device according to 6, where, every time the output regulating value stored in the output regulating value storing section is updated, the control circuit performs a write operation after an erase operation with respect to the output regulating value storing section.

8. The non-volatile memory device according to claim 6, wherein, when the output regulating value stored in the output regulating value storing section is updated for the first time, the control circuit performs a write operation after an erase operation with respect to the output regulating value storing section, and when the output regulating value stored in the output regulating value storing section is updated for the second time and thereafter, the control circuit performs a write operation without an erase operation with respect to the output regulating value storing section.

9. The non-volatile memory device according to claim 8, wherein the voltage regulating circuit outputs voltages different from each other by a value selected in a range of 0.1 to 0.4 V, depending on the number of bits having a predetermined value in the provided output regulating value.

10. The non-volatile memory device according to claim 1, further comprising an output regulating value temporarily holding circuit of temporarily storing the output regulating value to be provided to the voltage regulating circuit.

11. The non-volatile memory device according to claim 10, wherein the control circuit performs the steps of:
    selecting one of the erase unit areas;
    providing to the voltage regulating circuit the output regulating value stored in the output regulating value storing section corresponding to the selected erase unit area;
    performing a control so that, when the read determination circuit detects an abnormality as a result of the determination step after an erase operation and a write operation are performed with respect to the selected erase unit area, an output regulating value which causes an output voltage to be higher than before is set in the output regulating value temporarily holding circuit and the set output regulating value is provided to the voltage regulating circuit, and thereafter, an erase operation and a write operation are performed again with respect to the selected erase unit area; and setting the output regulating value stored in the output regulating value temporarily holding circuit into the output regulating value storing section corresponding to the selected erase unit area after the erase operation and the write operation are normally performed with respect to the selected erase unit area.

12. The non-volatile memory device according to claim 10, further comprising an error flag circuit of temporarily storing a result of the determination step performed by the read determination circuit.

13. The non-volatile memory device according to claim 12, wherein the control circuit performs the steps of:
selecting one of the erase unit areas;
providing to the voltage regulating circuit the output regulating value stored in the output regulating value storing section corresponding to the selected erase unit area;
performing a control so that, when the read determination circuit detects an abnormality as a result of the determination step after an erase operation and a write operation are performed with respect to the selected erase unit area, an output regulating value which causes an output voltage to be higher than before is set in the output regulating value temporarily holding circuit and the set output regulating value is provided to the voltage regulating circuit, and thereafter, an erase operation and a write operation are performed again with respect to the selected erase unit area; and
setting the output regulating value stored in the output regulating value temporarily holding circuit into the output regulating value storing section corresponding to the selected erase unit area only when an abnormality is stored in the error flag circuit after the erase operation and the write operation are normally performed with respect to the selected erase unit area.

14. The non-volatile memory device of claim 1, further comprising a plurality of monitor bits provided corresponding to the respective erase unit areas and each composed of a memory cell transistor of the same type as that of the erase unit area,
wherein an erase operation is performed with respect to the monitor bit when an erase operation is performed with respect to the corresponding erase unit area, and a write operation is performed with respect to the monitor bit when a write operation is performed with respect to all or a portion of the memory cell transistors included in the corresponding erase unit area.

15. The non-volatile memory device according to claim 14, wherein the control circuit performs the steps of:
selecting one of the erase unit areas;
providing to the voltage regulating circuit the output regulating value stored in the output regulating value storing section corresponding to the selected erase unit area; and
performing a control so that, when the read determination circuit detects an abnormality as a result of the determination step after an erase operation and a write operation are performed with respect to the selected erase unit area, an output regulating value which causes an output voltage to be higher than before is provided to the voltage regulating circuit, and thereafter, an erase operation and a write operation are performed again with respect to the selected erase unit area,
wherein the read determination circuit performs the determination step with respect to the monitor bit corresponding to the selected erase unit area.

16. The non-volatile memory device according to claim 1, further comprising a data latch circuit of temporarily storing a plurality of output regulating values to be set in the output regulating value storing section.

17. The non-volatile memory device according to claim 16, wherein the control circuit performs the steps of:
selecting one of the erase unit areas;
providing to the voltage regulating circuit the output regulating value stored in the output regulating value storing section corresponding to the selected erase unit area;
performing a control so that, when the read determination circuit detects an abnormality as a result of the determination step after an erase operation and a write operation are performed with respect to the selected erase unit area, an output regulating value which causes an output voltage to be higher than before is provided to the voltage regulating circuit, and thereafter, an erase operation and a write operation are performed again with respect to the selected erase unit area;
setting into the data latch circuit the output regulating value provided to the voltage regulating circuit when an erase operation and a write operation have been normally performed with respect to the selected erase unit area; and
setting the plurality of output regulating values stored in the data latch circuit into the output regulating value storing section after an erase operation and a write operation are normally performed with respect to all of the erase unit areas.

18. The non-volatile memory device according to claim 1, further comprising a fixed output regulating value storing section of storing a fixed output regulating value to be provided to the voltage regulating circuit.

19. The non-volatile memory device according to claim 18, wherein the control circuit performs the steps of:
selecting one of the erase unit areas;
providing to the voltage regulating circuit the output regulating value stored in the output regulating value storing section corresponding to the selected erase unit area; and
performing a control so that, when the read determination circuit detects an abnormality as a result of the determination step after an erase operation and a write operation are performed with respect to the selected erase unit area, an output regulating value which causes an output voltage to be higher than before is provided to the voltage regulating circuit, and thereafter, an erase operation and a write operation are performed again with respect to the selected erase unit area,
wherein one of the erase operation and the write operation with respect to the erase unit area is performed while the output regulating value stored in the fixed output regulating value storing section is provided to the voltage regulating circuit.

20. The non-volatile memory device according to claim 19, wherein one of the erase operation and the write operation with respect to the erase unit area, the one having a smaller influence on a change in characteristics of the memory cell transistor, is performed while the output regulating value stored in the fixed output regulating value storing section is provided to the voltage regulating circuit.

21. The non-volatile memory device according to claim 15, wherein, when an erase operation and a write operation are performed with respect to the selected erase unit area for the first time, the control circuit updates the output regulating value to be provided to the voltage regulating circuit, depending on a result of the determination step with respect to all data included in the selected erase unit area, and when an erase operation and a write operation are performed with respect to the selected erase unit area for the second time and thereafter, the control circuit updates the output regulating value to be provided to the voltage regulating circuit, depending on a result of the determination step with respect to the monitor bit corresponding to the selected erase unit area.

22. The non-volatile memory device according to claim 21, wherein, when an erase operation and a write operation are performed with respect to the selected erase unit area for the second time and thereafter, an output regulating value when an erase operation and a write operation have been normally performed with respect to the selected erase unit area is provided to the voltage regulating circuit, and thereafter, an erase operation and a write operation are preformed again with respect to the selected erase unit area.

23. The non-volatile memory device according to claim 1, further comprising a busy circuit of outputting a busy signal indicating that an erase operation and a write operation are being performed with respect to one of the erase unit area and the output regulating value storing section.

* * * * *